US011120872B2

(12) United States Patent
Lee et al.

(10) Patent No.: US 11,120,872 B2
(45) Date of Patent: Sep. 14, 2021

(54) RESISTIVE MEMORY DEVICES AND METHODS OF OPERATING RESISTIVE MEMORY DEVICES

(71) Applicant: SAMSUNG ELECTRONICS CO., LTD., Suwon-si (KR)

(72) Inventors: Jungyu Lee, Hwaseong-si (KR); Bilal Ahmad Janjua, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/848,149

(22) Filed: Apr. 14, 2020

(65) Prior Publication Data

US 2021/0098064 A1  Apr. 1, 2021

(30) Foreign Application Priority Data

Oct. 1, 2019 (KR) .................. 10-2019-0121358

(51) Int. Cl.
*G11C 11/00* (2006.01)
*G11C 13/00* (2006.01)

(52) U.S. Cl.
CPC ...... *G11C 13/0069* (2013.01); *G11C 13/0004* (2013.01); *G11C 13/004* (2013.01); *G11C 13/0026* (2013.01); *G11C 13/0028* (2013.01); *G11C 2013/0045* (2013.01); *G11C 2013/0078* (2013.01)

(58) Field of Classification Search
CPC ............ G11C 13/0069; G11C 13/0004; G11C 13/0026; G11C 13/0028
USPC ...................................................... 365/148
See application file for complete search history.

(56) References Cited

U.S. PATENT DOCUMENTS

| 6,639,824 | B1* | 10/2003 | Wohlfahrt | G11C 11/22 365/145 |
|---|---|---|---|---|
| 7,768,822 | B2 | 8/2010 | Sheu et al. | |
| 8,837,197 | B2 | 9/2014 | Oh et al. | |
| 9,355,720 | B2 | 5/2016 | Ahn et al. | |
| 9,922,691 | B2 | 3/2018 | Jain et al. | |
| 2009/0080255 | A1* | 3/2009 | Arita | G11C 16/10 365/185.09 |
| 2018/0350409 | A1 | 12/2018 | Dayley et al. | |

(Continued)

FOREIGN PATENT DOCUMENTS

| KR | 10-0574992 B1 | 5/2006 |
|---|---|---|
| KR | 10-0939118 B1 | 1/2010 |

*Primary Examiner* — Vu A Le
(74) *Attorney, Agent, or Firm* — Sughrue Mion, PLLC

(57) ABSTRACT

A resistive memory device includes a memory cell array of resistive memory cells connected to word and bit lines, each bay of the memory cell array including K tiles; a write/read circuit connected to the memory cell array through a row decoder and a column decoder, the write/read circuit being configured to perform a write operation in a target tile of the memory cell array, the write/read circuit comprising write drivers corresponding to the bays; a control voltage generator configured to generate first and second control voltages based on a reference current; and a control circuit configured to control the write/read circuit and the control voltage generator. A first write driver that corresponds to a first bay of the bays is configured to provide the target tile with a write current corresponding to a physical position of a selected memory cell of the target tile in the memory cell array.

20 Claims, 23 Drawing Sheets

(56) References Cited

U.S. PATENT DOCUMENTS

2018/0374540 A1* 12/2018 Hwang .................. G11C 16/12
2019/0377632 A1* 12/2019 Oh ...................... G06F 11/1048

* cited by examiner

RESISTIVE MEMORY DEVICES AND METHODS OF OPERATING RESISTIVE MEMORY DEVICES

CROSS-REFERENCE TO THE RELATED APPLICATION

This application claims priority from Korean Patent Application No. 10-2019-0121358, filed on Oct. 1, 2019 in the Korean Intellectual Property Office, the disclosure of which is incorporated herein by reference in its entirety.

BACKGROUND

1. Field

Apparatuses and methods consistent with example embodiments relate to memory devices, and more particularly to resistive memory devices and/or methods of operating resistive memory devices.

2. Related Art

Volatile memory is a type of computer storage that maintains data while the device is powered. Non-volatile memory is a type of computer storage that can retrieve stored information even after having been power cycled, e.g., after loss of power. Research into next-generation memory devices that are non-volatile and do not require refresh operations is being conducted in response to demand for high capacity and low power consumption memory devices. Next-generation memory devices generally require/include the high integrity characteristics of Dynamic Random Access Memory (DRAM), the non-volatile characteristics of flash memory, and the high speed of static RAM (SRAM). Examples of next-generation memory devices include Phase change RAM (PRAM), Nano Floating Gate Memory (NFGM), Polymer RAM (PoRAM), Magnetic RAM (MRAM), Ferroelectric RAM (FeRAM), and/or Resistive RAM (RRAM).

SUMMARY

One or more example embodiments provide a resistive memory device having increased performance.

One or more example embodiments provide a method of operating a resistive memory device to have increased performance.

According to some example embodiments, a resistive memory device includes a memory cell array including a plurality of resistive memory cells connected to a plurality of word-lines and to a plurality of bit-lines, the memory cell array being divided into a plurality of bays each of which comprises K tiles, K being a natural number greater than one; a write/read circuit connected to the memory cell array through a row decoder and through a column decoder, the write/read circuit being configured to perform a write operation in a target tile of the memory cell array, the write/read circuit comprising a plurality of write drivers corresponding to the plurality of bays; a control voltage generator configured to generate a first control voltage and a second control voltage based on a reference current, and provide the first control voltage and the second control voltage to the write/read circuit; and a control circuit configured to control the write/read circuit and the control voltage generator. A first write driver of the plurality of write drivers that corresponds to a first bay of the plurality of bays is configured to provide the target tile with a write current corresponding to a physical position of a selected memory cell of the target tile in the memory cell array.

According to some example embodiments, a resistive memory device includes a memory cell array including a plurality of resistive memory cells connected to a plurality of word-lines and to a plurality of bit-lines, the memory cell array being divided into a plurality of bays each of which comprises K tiles, K being a natural number greater than one; a row decoder connected to the memory cell array through the plurality of word-lines, the row decoder comprising a plurality of row selection switches; a column decoder connected to the memory cell array through the plurality of bit-lines, the column decoder comprising a plurality of column selection switches; a write/read circuit connected to the memory cell array through the row decoder and the column decoder, the write/read circuit being configured to perform a write operation in a target tile of the memory cell array, the write/read circuit comprising a plurality of write drivers corresponding to the plurality of bays; a control voltage generator configured to generate a first control voltage and a second control voltage based on a reference current, and provide the first control voltage and the second control voltage to the write/read circuit; and a control circuit configured to control the write/read circuit and the control voltage generator based on a command and an address. A first write driver of the plurality of write drivers that corresponds to a first bay of the plurality of bays is configured to provide the target tile with a write current corresponding to a physical position of a selected memory cell of the target tile in the memory cell array.

According to some example embodiments, there is provided method of operating a resistive memory device including a memory cell array that includes a plurality of resistive memory cells connected to a plurality of word-lines and to a plurality of bit-lines, wherein the memory cell array is divided into a plurality of bays, each of the plurality of bays includes K tiles, and K is a natural number greater than one, the method comprising: identifying a selected memory cell from among the plurality of resistive memory cells that is provided in a target tile based on a row address and a column address indicated in a write command; and providing, by a first write driver of the write drivers, a write current corresponding to a physical position of the selected memory cell of the target tile in the memory cell array based on the write command.

BRIEF DESCRIPTION OF THE DRAWINGS

The above and other aspects and features will become more apparent by describing in detail example embodiments with reference to the accompanying drawings, in which.

DETAILED DESCRIPTION

Example embodiments will be described more fully hereinafter with reference to the accompanying drawings.

Figure 1:
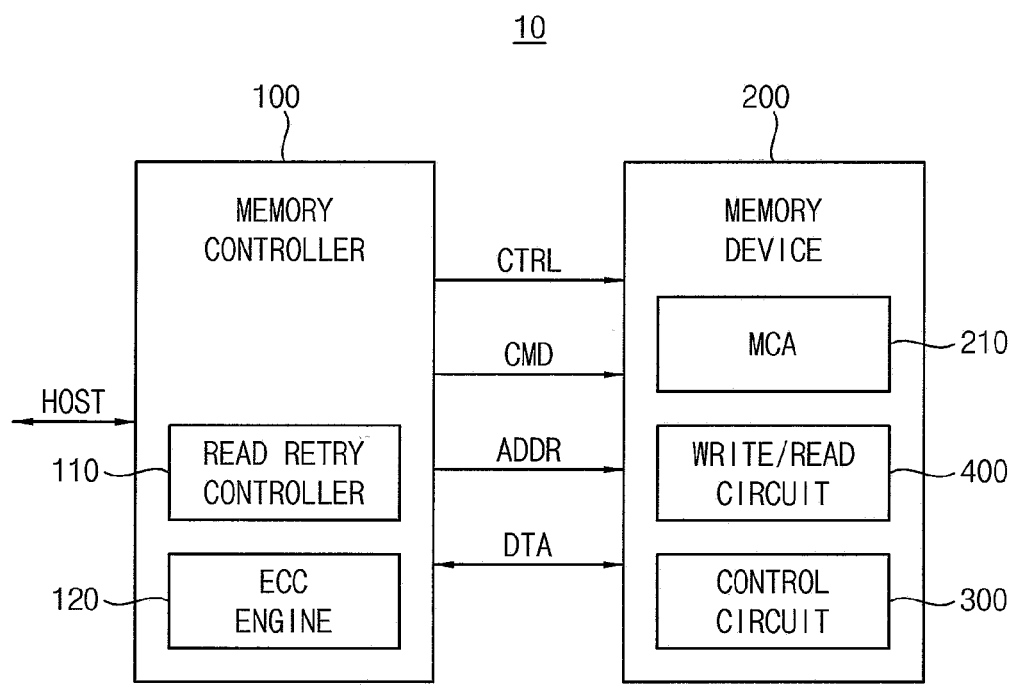
FIG. 1 is a block diagram illustrating a memory system according to some example embodiments.

FIG. 1 is a block diagram illustrating a memory system according to some example embodiments.

A memory device that includes resistive type memory cells may be referred to as a resistive type memory device. Alternatively or additionally, the memory device may include various types of memory cells. For example, the memory device may include a heterogeneous collection of memory cells. Because the memory cells may be disposed at cross-points of multiple first signal lines and multiple second signal lines, the memory device may be referred to as a cross-point memory device.

Referring to FIG. 1, a memory system 10 includes a memory controller 100 and a resistive memory device 200. The resistive memory device 200 includes a memory cell array 210, a control circuit 300, and a write/read circuit 400. When the memory cell array 210 includes a plurality of resistive type memory cells, the memory system 10 may be referred to as a resistive (type) memory system.

In response to a write/read request from a host, the memory controller 100 reads data stored in the resistive memory device 200 and/or controls the resistive memory device 200 to write data to the resistive memory device 200. In some example embodiments, the memory controller 100 provides an address (signal) ADDR, a command (signal) CMD, and a control signal CTRL to the resistive memory device 200 to control a program (or write) operation and/or a read operation with respect to the resistive memory device 200.

In addition, write-target data DTA and read data DTA may be exchanged between the memory controller 100 and the resistive memory device 200. For example, the write-target data DTA can be written to the resistive memory device 200 in response to a write command and the read data DTA can be read from the resistive memory device 200 in response to a read command.

In addition, the memory controller 100 may include a read-retry controller 110 (e.g., a control circuit) and/or an error correction code (ECC) engine 120 (e.g., an ECC circuit). The read retry controller 110 may control the memory controller 100 to operate in a read-retry mode to perform a read-retry operation. The ECC engine 120 may perform error detection and correction on data that is provided from the resistive memory device 200. For example, the ECC engine 120 can detect whether the data has an error and potentially correct the error.

The memory cell array 210 may include includes a plurality of memory cells that are disposed respectively in regions where first signal lines and second signal lines cross. In addition, each of the memory cells may be a single level cell (SLC) that stores one bit data, or may be a multilevel cell (MLC) that stores at least two-bit data.

Alternatively, the memory cell array 210 may include both the SLCs and the MLCs.

In some example embodiments, the memory cell array 210 includes memory cells with a two-dimensional horizontal structure. Alternatively or additionally, the memory cell array 210 includes memory cells with a three-dimensional vertical structure.

The memory cell array 210 may include resistive-type (resistive) memory cells that include a variable resistor element. For example, when resistance of the variable resistor element that is formed of a phase change material (e.g., Ge—Sb—Te) is changed according to a temperature, a resistive memory device is a phase change RAM (PRAM). As another example, when the variable resistor device is formed of a complex metal oxide including an upper electrode, a lower electrode, and a transition metal oxide therebetween, the resistive memory device is a resistive RAM (RRAM). As another example, when the variable resistor device is formed of an upper electrode of a magnetic material, a lower electrode of the magnetic material, and a dielectric therebetween, the resistive memory device is a magnetic RAM (MRAM). The memory cell array 210 may include a heterogeneous collection of resistive-type memory cells; for example, the memory cell array 210 may include a PRAM cell, an RRAM cell, and an MRAM cell; however, example embodiments are not limited thereto.

The write/read circuit 400 performs a write operation and a read operation on the memory cells. In some example embodiments, the write/read circuit 400 is connected to the memory cells through bit-lines, and includes write drivers (e.g., driving circuits) that write data to the memory cells, and sense amplifiers that sense resistive components of the memory cells.

In some example embodiments, the control circuit 300 controls operations of the resistive memory device 200, and controls the write/read circuit 400 so as to perform a memory operation such as a write operation or a read operation. For the write and read operations of the resistive memory device 200, the control circuit 300 may provide pulse signals such as a write pulse or a read pulse to the write/read circuit 400. For example, the write/read circuit 400 may provide a write current (or a write voltage) in response to the write pulse to the memory cell array 210 and provide a read current (or a read voltage) in response to the read pulse to the memory cell array 210. The read current/write current or the read voltage/write voltage may be the same as, or different from, each other.

In the write operation on the resistive memory device 200, a resistance value of a variable resistor of a memory cell of the memory cell array 210 may be increased or decreased, depending on write data associated with the write operation. For example, each of the memory cells of the memory cell array 210 may have a resistance value according to data that is currently stored therein, and the resistance value may be increased or decreased, depending on data to be written to each of the memory cells.

In some example embodiments, the write operation is divided into a reset write operation and a set write operation. In a set state, a resistive memory cell may have a relatively low resistance value, and in a reset state, the resistive memory cell may have a relatively high resistance value. The reset write operation may involve performing a write operation so as to increase a resistance value of a variable resistor of the resistive memory cell, and the set write operation may involve performing a write operation so as to decrease the resistance value of the variable resistor of the resistive memory cell.

In some example embodiments, when a detected error of data read by the resistive memory device 200 is not correctable, the memory controller 100 controls the resistive memory device 200 to operate in a read-retry mode to perform a read-retry operation. For example, the ECC engine 120 can determine whether the data read has an error and whether that error is correctable. During the read-retry operation, the memory device 200 reads (or re-reads) data while the memory device 200 changes a reference (e.g., a read reference) for determining data "0" and data "1", analyzes a valley in a resistance level distribution of memory cells by performing a data determination operation on the read data, and based on the analysis result, performs a recovery algorithm of selecting a read reference so as to minimize or reduce error occurrence of the data. The read-retry operation may be controlled by the read-retry controller 110.

Figure 2:
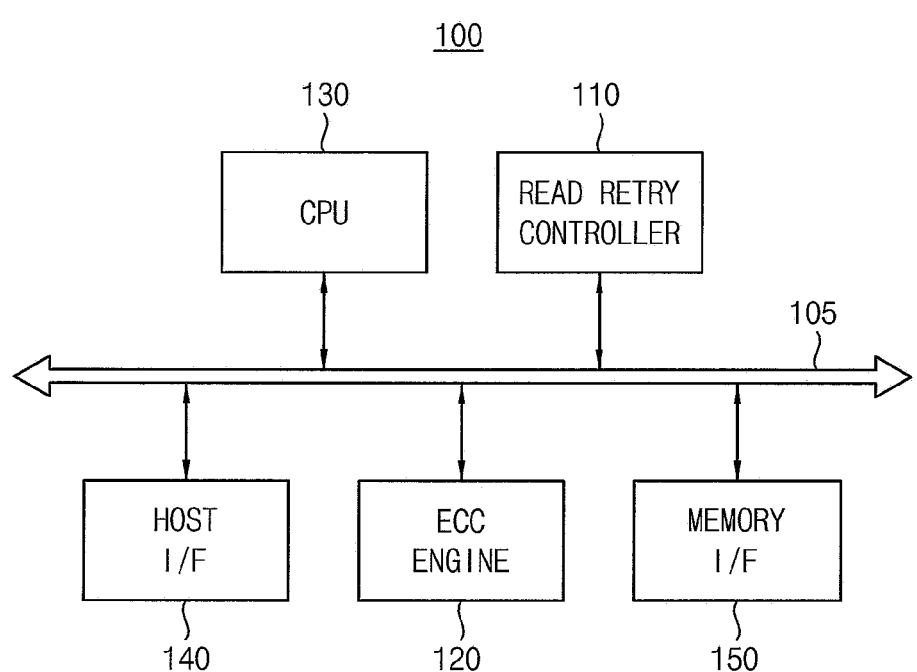
FIG. 2 is a block diagram illustrating the memory controller in FIG. 1 according to some example embodiments.

FIG. 2 is a block diagram illustrating the memory controller in FIG. 1 according to some example embodiments.

Referring to FIG. 2, the memory controller 100 includes the read-retry controller 110, the ECC engine 120, a central processing unit (CPU) 130, a host interface 140, and a memory interface 150. The read-retry controller 110, the ECC engine 120, the central processing unit (CPU) 130, the host interface 140, and the memory interface 150 may communicate with one another through a system bus 105.

The CPU 130 controls operations of the memory controller 100. For example, the CPU 130 may control various function blocks related to a memory operation on the resistive memory device 200. The host interface 140 interfaces with the host. For example, the host interface 140 may receive a request for the memory operation from the host. For example, the host interface 140 receives, from the host, requests for reading and/or writing data, and in response to the requests, the host interface 140 generates internal signals for the memory operation on the memory device 200.

In some example embodiments, the ECC engine 120 performs an ECC encoding process on write data and an ECC decoding process on read data. For example, the ECC engine 120 may perform an error detection operation on data that is read from the resistive memory device 200, and may perform an error correction operation on the read data when a result of the error detection operation indicates an error is present. The read-retry controller 110 may provide various types of information for controlling an operation of the memory device 200 during the read-retry mode, as previously described. The memory interface 150 interfaces with the resistive memory device 200 to exchange various signals (e.g., command, address, mode signals, reference information, data, etc.) between the memory controller 100 and the resistive memory device 200.

Figure 3:
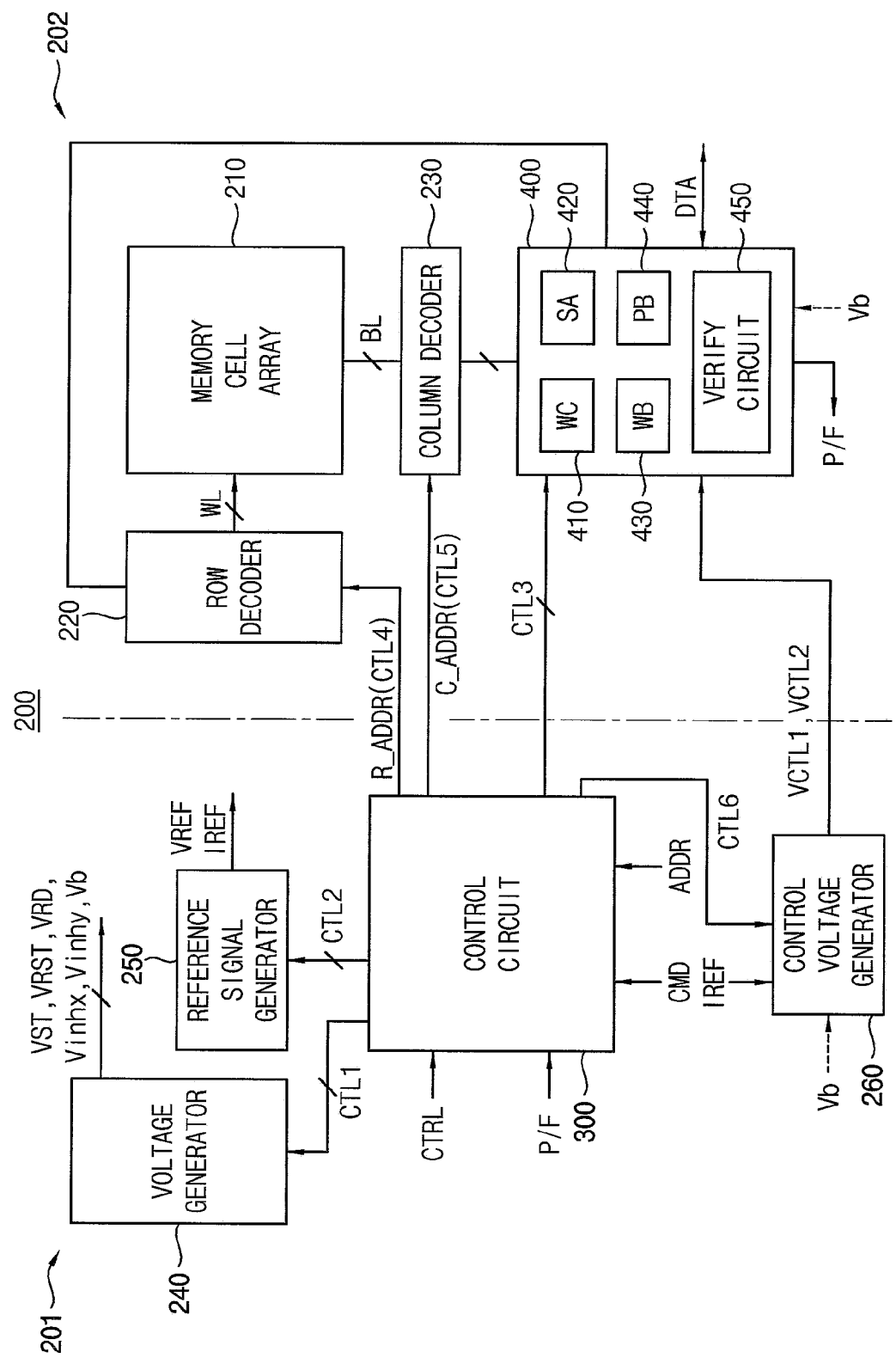
FIG. 3 is a block diagram illustrating the resistive memory device in FIG. 1 according to some example embodiments.

FIG. 3 is a block diagram illustrating the resistive memory device in FIG. 1 according to some example embodiments.

Referring to FIG. 3, the resistive memory device 200 includes the memory cell array 210, the control circuit 300, a control voltage generator 260 and the write/read circuit 400. In addition, the resistive memory device 200 may further include a row decoder 220, a column decoder 230, a voltage generator 240, and a reference signal generator 250. The memory cell array 210, and the write/read circuit 400, the row decoder 210 and the column decoder 230 may be formed in a core region 202 of a semiconductor substrate in which the resistive memory device 200 is formed. The control voltage generator 260, the voltage generator 240, and the reference signal generator 250 may be formed in a peripheral region 201 of the semiconductor substrate. The write/read circuit 400 may include a write driver 410, a sense amplifier including a read circuit 420, a write buffer 430, a page buffer 440, and a verify circuit 450. The write circuit 410 may include a plurality of write drivers.

Memory cells that are arranged in the memory cell array 210 are connected to word-lines WL and bit-lines BL. Because various voltage signals or current signals are provided through the bit-lines BL and the word-lines WL, data may be written to or read from selected memory cells, and writing data to or reading data from residual unselected memory cells may be prevented, or reduced in likelihood of occurrence.

The address (or, access address) ADDR accompanied with the command CMD for indicating an access-target memory cell may be received by the control circuit 300. In some example embodiments, the address ADDR includes a row address R_ADDR for selecting word-lines WL of the memory cell array 210, and a column address C_ADDR for selecting bit-lines BL of the memory cell array 210. The row decoder 220 performs a word-line selecting operation in response to the row address R_ADDR, and the column decoder 230 performs a bit-line selecting operation in response to the column address C_ADDR.

The write/read circuit 400 may be connected to the bit-lines BL and thus may write data to a memory cell or may read data from the memory cell. The write/read circuit 400 may be connected to the row decoder 220 and the column decoder 230, For example, a set voltage VST or a reset voltage VRST may be provided from the voltage generator 240 to a selected memory cell, inhibit voltages Vinhx and Vinhy may be provided from the voltage generator 240 to unselected word-lines and unselected bit-lines, and in a read operation, a read voltage VRD may be provided from the voltage generator 240 to the selected memory cell. The write/read circuit 400 may provide a write voltage or a write current according to data to the memory cell array 210 through the column decoder 230. Alternatively or additionally, in order to determine the data in the read operation, the write/read circuit 400 may include a comparator that is connected to a node (e.g., a data sensing node) of a bit-line BL, and may read a data value by performing a comparison operation on a sensing voltage or a sensing current of the sensing node. A reference voltage VREF and/or a reference current IREF may be provided to the write/read circuit 400 and thus may be used in a data determination operation. The reference signal generator 250 may generate the reference voltage VREF and/or the reference current IREF. The reference signal generator 250 may provide the reference current IREF to the control voltage generator 250 and the voltage generator 240 may provide a bias voltage Vb to the control voltage generator 260 and/or the write/read circuit 400.

Alternatively or additionally, the write/read circuit 400 may provide the control circuit 300 with a pass/fail signal P/F according to a read result with respect to the read data. The control circuit 300 may refer to the pass/fail signal P/F and thus control write and read operations of the memory cell array 210.

In some example embodiments, the control circuit 300 generates a plurality of control signals CTL1~CTL6 based on the command CMD, the address ADDR, the control signal CTRL and the pass/fail signal P/F. In some example embodiments, the control circuit 300 provides a first control signal CTL1 to the voltage generator 240, provides a second control signal CTL2 to the reference signal generator 250, provides a third control signal CTL3 to the write/read circuit 400, provides a fourth control signal CTL4 to the row decoder 220, provides a fifth control signal CTL5 to the column decoder 230 and provides a sixth control signal CTL6 to the control voltage generator 260.

The control circuit 300 may control at least one of the row decoder 220, the column decoder 230, the control voltage generator 260, and the write/read circuit 400 based on the row address R_ADDR and/or the column address C_ADDR (e.g., the address ADDR).

Figure 4:
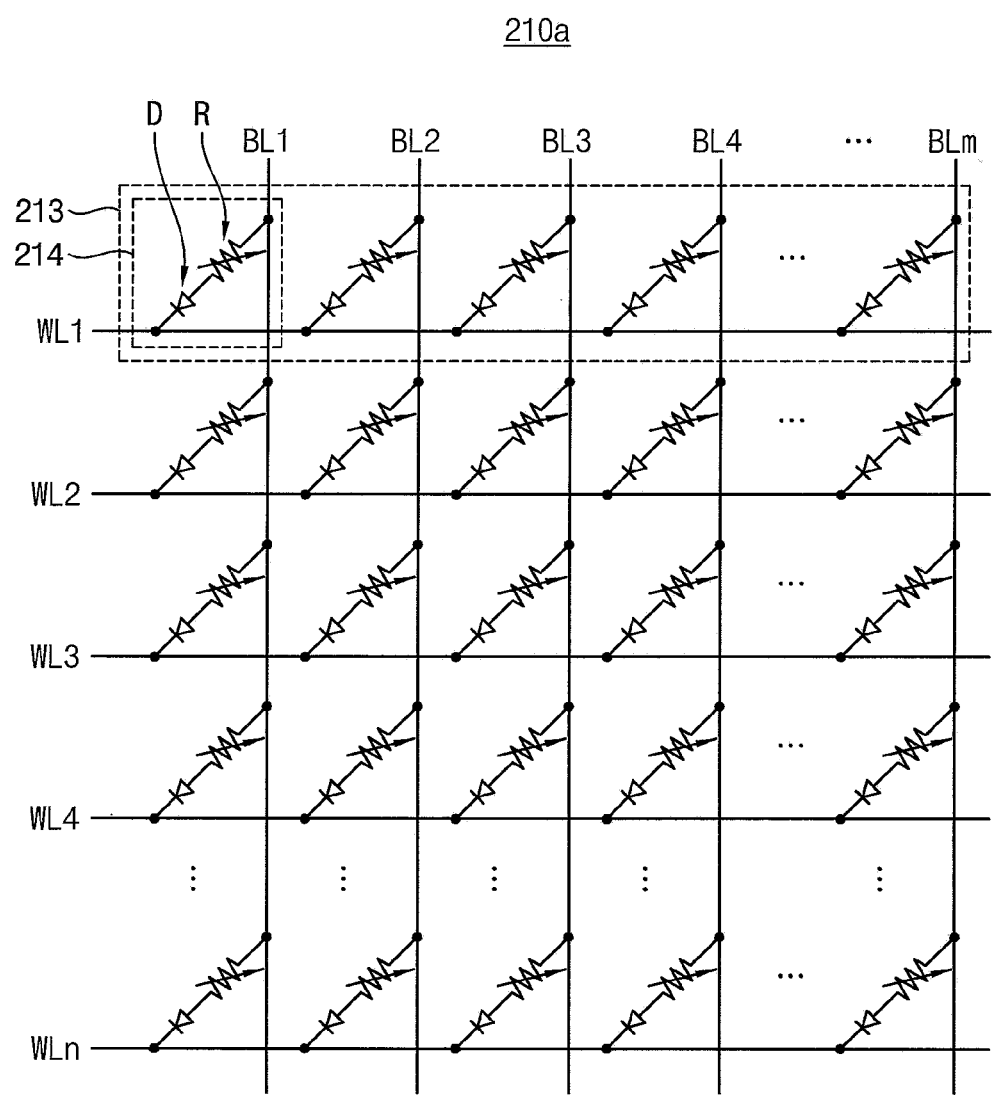
FIG. 4 is a circuit diagram illustrating a memory cell array according to some example embodiments.

FIG. 4 is a circuit diagram illustrating a memory cell array in FIG. 3 according to some example embodiments.

A memory cell array 210a includes multiple cells, and FIG. 4 shows a cell array having a cell block including these multiple cells.

Referring to FIG. 4, the memory cell array 210a includes a plurality of word-lines WL1 through WLn, a plurality of bit-lines BL1 through BLm, and a plurality of memory cells 214. While FIG. 4 illustrates five word-lines WL, example embodiments are not limited thereto as there may fewer than five or more than five word-lines WL. For example, the number n of word lines WL may be the same as, or different from, the number m of bit-lines BL. The memory cells MC connected to one word-line may be defined as a page unit 213.

In some example embodiments, each of the memory cells MC includes a variable resistor R and a selection device D. Here, the variable resistor R may be referred to as a variable resistor element and/or a variable resistor material, and the selection device D may be referred to as a switching element. The variable resistor R is connected between one of the bit-lines BL1 through BLm and the selection device D, and the selection device D is connected between the variable resistor device R and one of the word-lines WL1 through WLn.

A resistance value of the variable resistor R may be changed to one of multiple resistive states. For example, the resistance value may change in response to an electric pulse being applied to the corresponding variable resistor R.

In some example embodiments, the phase-change material has an amorphous state that is relatively high-resistive, and a crystal state that is relatively low-resistive. A phase of the phase-change material may be changed by Joule heat that is generated by the current. Using changes of the phase, data may be written to the corresponding cell.

The selection device D is connected between one of the word-lines WL1 through WLn and the variable resistor R, and according to a voltage applied to the connected word-line and bit-line, a current that is supplied to the variable resistor R is controlled. In some example embodiments, the selection device D is a PN-junction diode or a PIN-junction diode. An anode of the diode may be connected to the variable resistor R, and a cathode of the diode may be connected to one of the word-lines WL1 through WLn. Here, when a voltage difference between the anode and the cathode of the diode is greater than a threshold voltage of the diode, for example is greater than 0.7 volts, the diode is turned on so that the current is supplied to the variable resistor R.

Figure 5A:
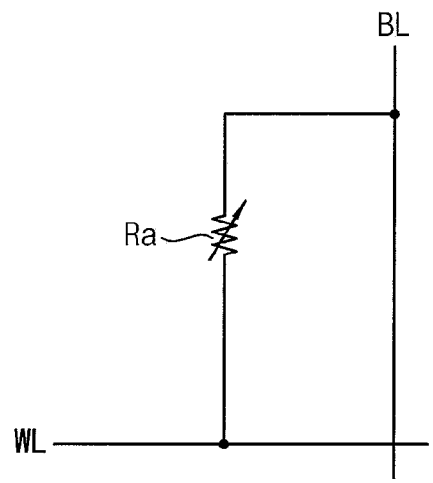
FIGS. 5A, 5B and 5C are circuit diagrams of memory cells according to some example embodiments.
Figure 5B:
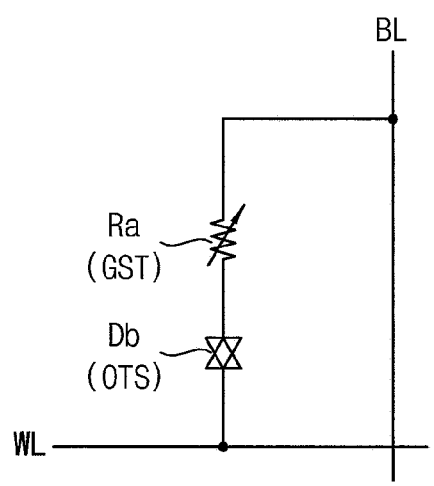
Figure 5C:
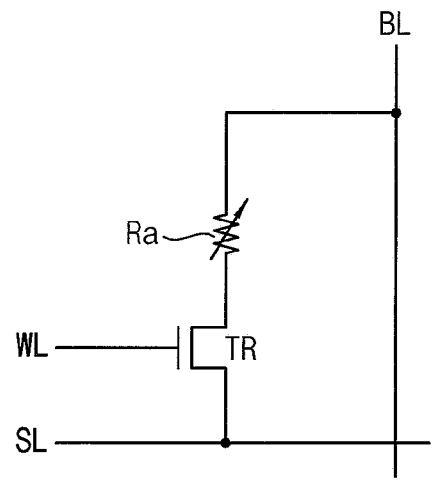

FIGS. 5A, 5B and 5C are circuit diagrams of memory cells according to example embodiments. For example, the memory cells in FIGS. 5A, 5B and 5C are examples of a memory cell in FIG. 4.

Referring to FIG. 5A, a memory cell 214a according to an example embodiment includes a variable resistor Ra connected between, e.g., directly connected between, a bit-line BL and a word-line WL. The memory cell 214a stores data due to voltages that are applied to the bit-line BL and the word-line WL, respectively.

Referring to FIG. 5B, a memory cell 214b according to an example embodiment includes a variable resistor Rb and a bidirectional diode Db. The variable resistor Rb includes a resistive material so as to store data. The bidirectional diode Db is connected between, e.g., directly connected between, the variable resistor Rb and a word-line WL, and the variable resistor Rb is connected between, e.g., directly connected between, a bit-line BL and the bidirectional diode Db. Alternatively, positions of the bidirectional diode Db and the variable resistor Rb may be changed. By using the bidirectional diode Db, leakage current that may flow through a non-selected resistor cell may be eliminated or reduced. The variable resistor Rb may include a phase change material such as GeSbTe (GST) and the bidirectional diode Db may include an ovonic threshold switch (OTS).

Referring to FIG. 5C, a memory cell 214c according to an example embodiment includes a variable resistor Rc and a transistor TR. The transistor TR is a selection device (e.g., a switching device), which connects the variable resistor Rc to a source line SL according to a voltage of a word-line WL. For example, current may be selectively supplied to the variable resistor Rc according to the voltage of a word-line WL. As illustrated in FIG. 5C, in addition to the word-line WL, the source line SL is additionally arranged to adjust voltage levels at both ends of the variable resistor Rc. The transistor TR is connected between the variable resistor Rc and the source line SL, and the variable resistor Rc is connected between (e.g., directly connected between) a bit-line BL and the transistor TR. Alternatively, positions of the transistor TR and the variable resistor Rc are changed with respect to each other. The memory cell 214c is selected or not selected according to the ON or OFF state of the transistor TR that is driven by the word-line WL.

Figure 6:
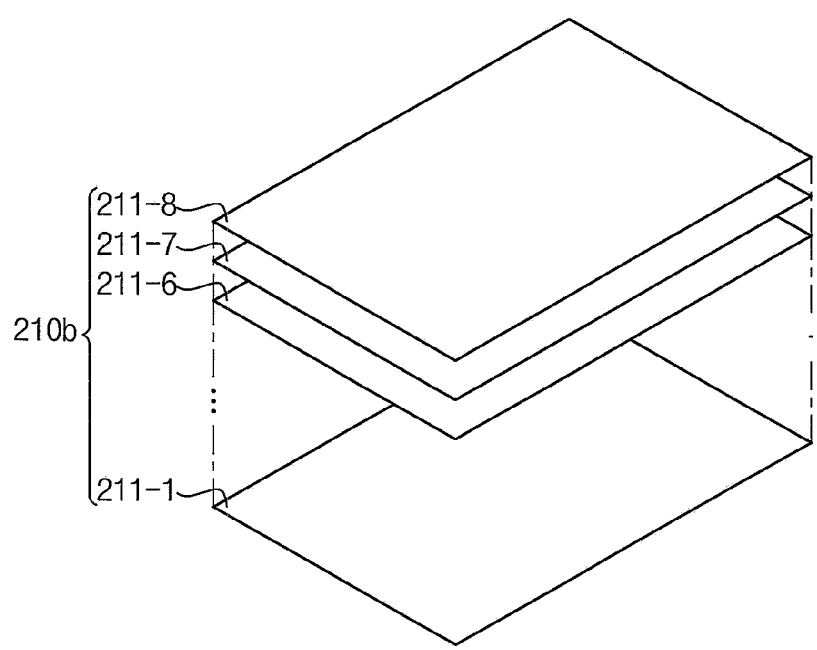
FIG. 6 is a diagram illustrating a memory cell array according to some example embodiments.

FIG. 6 is a diagram illustrating a memory cell array according to an example embodiment.

Referring to FIG. 6, a memory cell array 210b is implemented with a three-dimensional stacked structure. The example three-dimensional stacked structure includes multiple, vertically stacked, memory cell layers 211_1~211_8. However, example embodiments are not limited thereto, and a memory cell array may include different numbers of memory cell layers.

Each of the memory cell layers 211_1~211_8 may include a normal cell array and a redundancy cell array. When the memory cell array 210b has a three-dimensional laminated structure, each of the memory cell layers 211_1~211_8 has the cross point structure illustrated in FIG. 4.

Figure 7A:
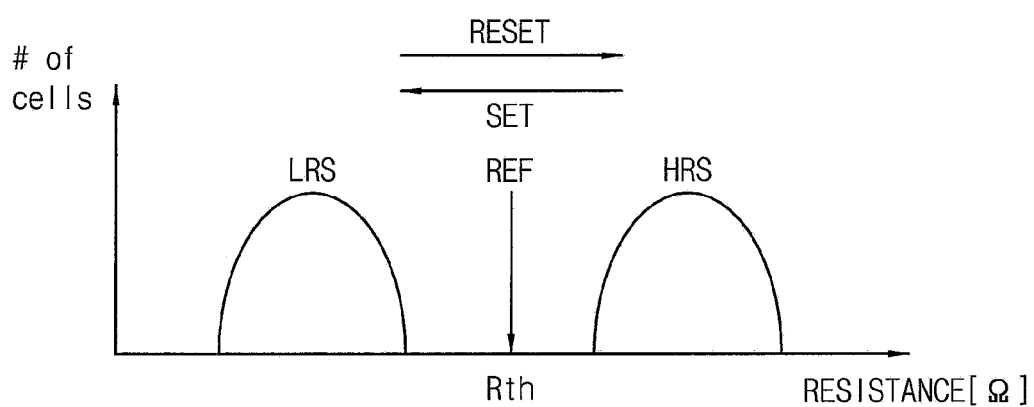
FIG. 7A illustrates resistance distribution of a single-level memory cell.

FIG. 7A illustrates resistance distribution of a single-level cell.

Referring to FIG. 7A, a horizontal axis denotes a resistance, and a vertical axis denotes a number of memory cells. For example, if a memory cell (for example, the memory cell 124) is a single-level cell to which 1 bit is programmed, the memory cell can have a low resistance state LRS. Example embodiments are not limited thereto, and a memory cell may be a cell to which 1 is programmed while the memory cell has a high resistance state HRS. A set operation, e.g., a set write operation, refers to a switching operation for the memory cell 124 from the high resistance state HRS to the low resistance state LRS by applying a write pulse to the memory cell. In addition, a reset operation, e.g., a reset write operation, refers to a switching operation for the memory cell from the low resistance state LRS to the high resistance state HRS by applying a write pulse to the memory cell.

A threshold resistance Rth may be set as a resistance between the distribution of the low resistance state LRS and the distribution of the high resistance state HRS. In a read operation performed on a memory cell, when a read result is greater than or equal to the threshold resistance Rth, the read result may be determined to be the high resistance state HRS, and when the read result is less than threshold resistance Rth, the read result may be determined to be the low resistance state LRS. In some example embodiments, information on a read reference REF corresponding to the threshold resistance Rth is received from the memory controller 100. For example, the information may be used to determine the threshold resistance Rth of a memory cell. Cells with a resistance value of less than Rth may correspond to cells with a logic value of "0", while cells with a resistance value of greater than or equal to Rth may correspond to cells with a logic value of "1"; however, example embodiments are not limited thereto.

Figure 7B:
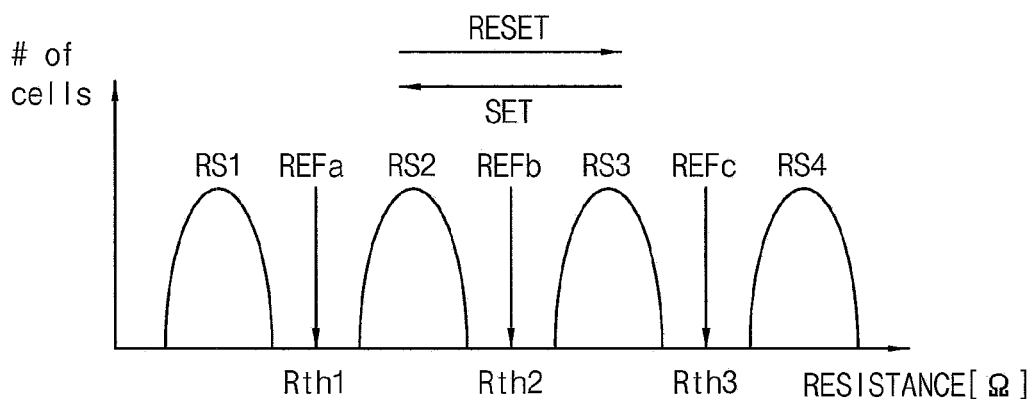
FIG. 7B illustrates resistance distribution of a multi-level memory cell.

FIG. 7B illustrates resistance distribution of a multi-level memory cell.

Referring to FIG. 7B, the horizontal axis denotes resistance, and the vertical axis denotes the number of memory cells. For example, if a memory cell is a multi-level cell to which 2 bits are programmed, the memory cell may have one of a first resistance state RS1, a second resistance state RS2, a third resistance state RS3, and a fourth resistance state RS4. In an example embodiment, the first resistance state RS1 and the second resistance state RS2 may be referred to as a low resistance state while the third resistance state RS3 and the fourth resistance state RS4 may be referred to as a high resistance state.

A resistance between the distribution of the first resistance state RS1 and the distribution of the second resistance state RS2 may be set to be a first threshold resistance Rth1; a resistance between the distribution of the second resistance state RS2 and the distribution of the third resistance state RS3 may be set to be a second threshold resistance Rth2; and a resistance between the distribution of the third resistance state RS3 and the distribution of the fourth resistance state RS4 may be set to be a third threshold resistance Rth3. In a read operation performed on the memory cells 214, when a read result is equal to or greater than the first threshold resistance Rth1, the read result may be determined to be one of the second to fourth resistance states RS2, RS3, and RS4, and when the read result is less than the first threshold resistance Rth1, the read result may be determined to be the first resistance state RS1. In an example embodiment, information on read references REFa, REFb, and REFc respectively corresponding to the first, second, and third threshold resistances Rth1, Rth2, and Rth3 are received from the memory controller 100. There may be a mapping between logic values of cells and cells with a resistance value less than Rth1, between Rth1 and Rth2, between Rth2 and Rth3, and greater than Rth3. For example, cells with a resistance value of less than Rth1 may be cells with a logic value corresponding to "00", cells with a resistance value between Rth1 and Rth2 may be cells with a logic value corresponding to "01", cells with a resistance value between Rth2 and Rth3 may be cells with a logic value corresponding to "11", and cells with a resistance value greater than Rth3 may be cells with a logic value corresponding to "10"; however, example embodiments are not limited thereto, and there may be other such mappings.

Figure 8A:
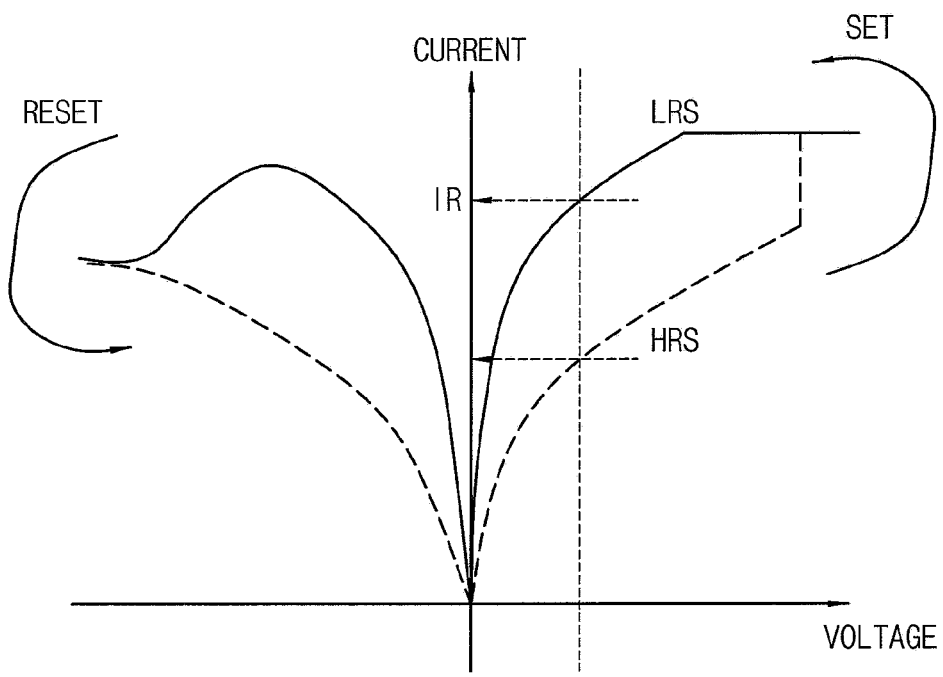
FIG. 8A illustrates a current and voltage characteristic curve of the memory cell in FIG. 4.

FIG. 8A illustrates a current and voltage characteristic curve of the memory cell in FIG. 4.

Referring to FIG. 8A, a horizontal axis represents voltage and a vertical axis represents current. The solid line indicates a low resistance state (LRS). The dashed line indicates a high resistance state (HRS). The memory cell 214 shows a switching behavior of a set write state from the HRS to the LRS as a voltage increases. The memory cell 214 shows a switching behavior of a reset write state from the LRS to the HRS as a voltage decreases. The memory cell 214 may determine the low resistance state or the high resistance state by detecting a write current IR at a certain voltage.

Figure 8B:
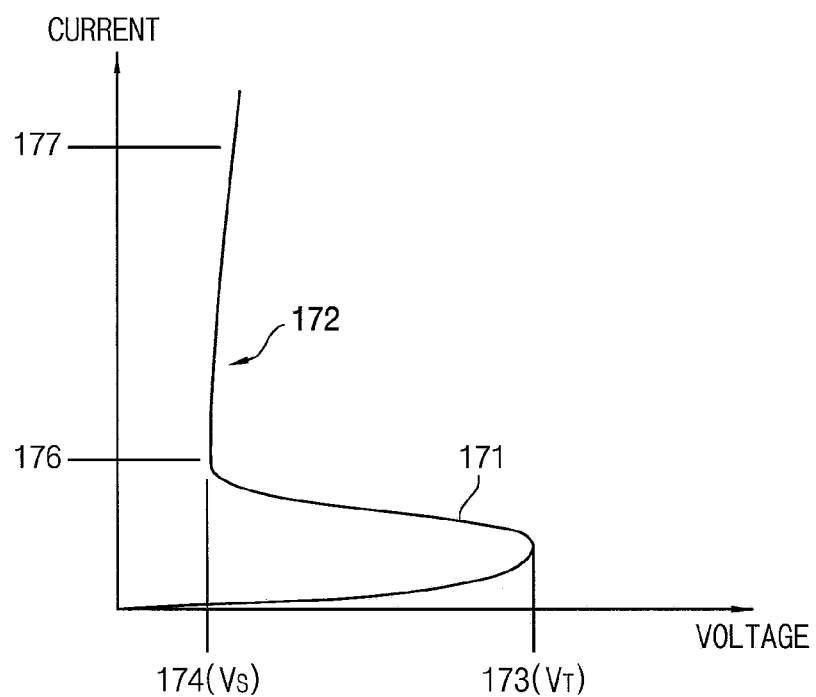
FIG. 8B illustrates a current and voltage characteristic curve of the memory cell in FIG. 4.

FIG. 8B illustrates a current and voltage characteristic curve of the memory cell in FIG. 4.

Referring to FIG. 8B, a first portion 171 of the curve shows a voltage-current relationship in a state when minimal current flows through the selection device D in FIG. 4. The selection device D may serve as a switching device having the threshold voltage $V_T$ of a first voltage level 173. When both a voltage and current are 0 and the voltage gradually increases, current may hardly flow through the selection device D until the voltage reaches the threshold voltage $V_T$, e.g., the first voltage level 163. However, as soon as the voltage exceeds the threshold voltage $V_T$, the current flowing through the selection device D may be rapidly increased, and the voltage applied to the selection device D may decease to a saturation voltage $V_S$, e.g., a second voltage level 174.

A second portion 172 of the curve a voltage-current relation in a state when current flows through the selection device D. As the current flowing through the selection device D increases to be greater than a first current level 176, the voltage applied to the selection device D may increase to be slightly greater than the second voltage level 174. For example, while the current flowing through the selection device D considerably increases from the first current level 176 to a second current level 177, the voltage applied to the selection device D may only slightly increase from the second voltage level 174. For example, once the current starts to flow through the selection device D, the voltage applied to the selection device D may be almost maintained at the saturation voltage $V_S$. When the current decreases below a holding current level, e.g., the first current level 176, the selection device D may be converted back to a resistance state, and thus the current may be effectively blocked until the voltage increases to the threshold voltage $V_T$.

Figure 9:
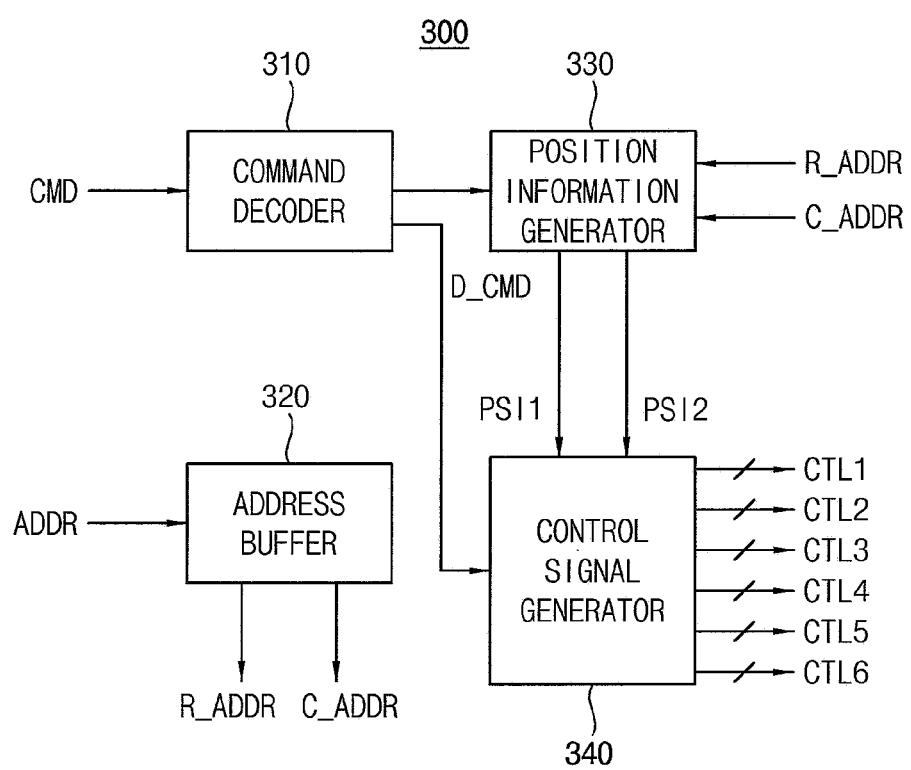
FIG. 9 is a block diagram illustrating a control circuit in the resistive memory device of FIG. 3 according to some example embodiments.

FIG. 9 is a block diagram illustrating a control circuit in the resistive memory device of FIG. 3 according to some example embodiments.

Referring to FIG. 9, the control circuit 300 includes a command decoder 310, an address buffer 320, a position information generator 330, and a control signal generator 340 and a register 350.

The command decoder 310 decodes the command CMD to generate a decoded command D_CMD, and provides the decoded command D_CMD to the control signal generator 340.

The address buffer 320 receives the address ADDR, provides the row address R_ADDR to the row decoder 220 and the position information generator 330, and provides the column address C_ADDR to the column decoder 230 and the position information generator 330.

The position information generator 330 receives the row address R_ADDR and the column address C_ADDR, and generates position information PSI1 and PSI2 indicating a position information PSI1 and PSI2 of the selected memory cell designated by the row address R_ADDR and the column address C_ADDR, and provides the position information PSI1 and PSI2 to the control signal generator 340. The position information PSI1 may include position information associated with a bay including the selected memory cell.

The control signal generator 340 receives the decoded command D_CMD and the position information PSI1 and PSI2, and generates the first through sixth control signals CTL1~CTL6 based on an operation designated by the decoded command D_CMD and the position of the selected memory cell.

The control signal generator 340 provides the first control signal CTL1 to the voltage generator 240, provides the second control signal CTL2 to the reference signal generator 250, provides the third control signal CTL3 to the write/read circuit 400, provides the fourth control signal CTL4 to the row decoder 220, provides the fifth control signal CTL5 to the column decoder 230 and provides the sixth control signal CTL6 to the control voltage generator 260.

Figure 10:
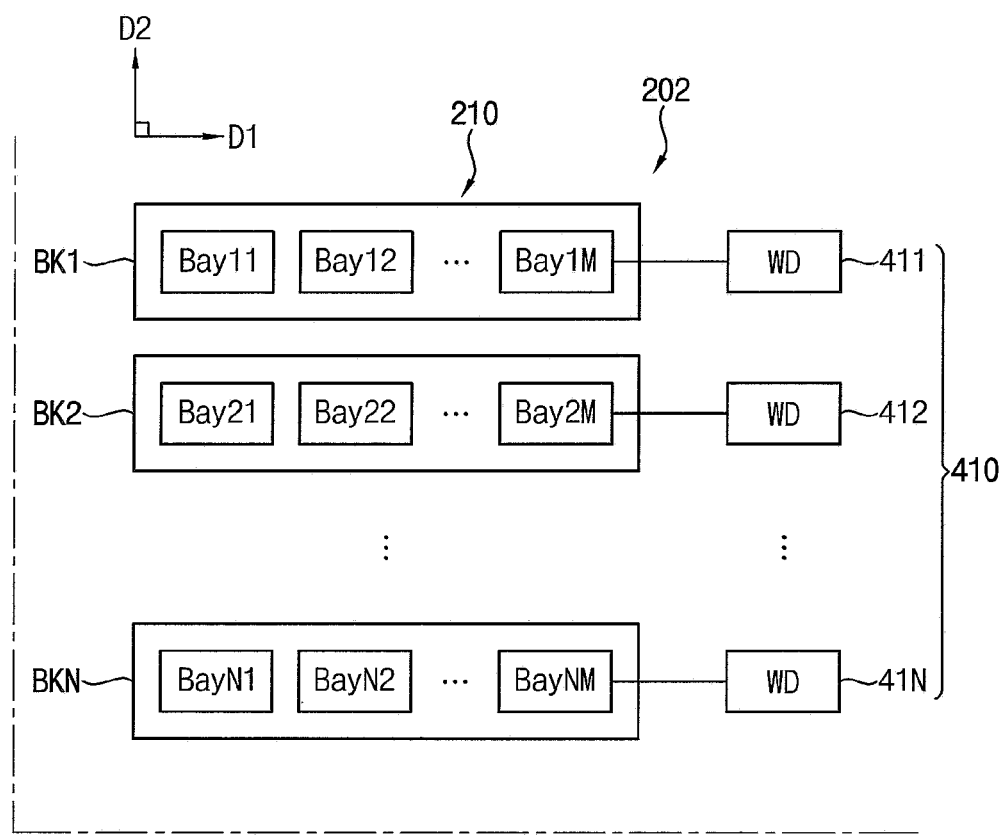
FIG. 10 illustrates a memory cell array, a write circuit and a control voltage generator in the resistive memory device of FIG. 3 according to some example embodiments.
Figure 10:
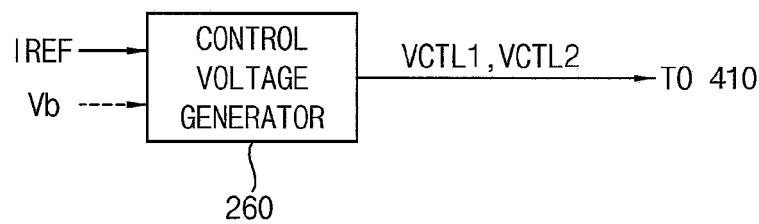

FIG. 10 illustrates a memory cell array, a write circuit and a control voltage generator in the resistive memory device of FIG. 3 according to some example embodiments.

Referring to FIG. 10, the memory cell array 400 and the write circuit 410 are disposed in the core region 202 of the semiconductor substrate and the control voltage generator 260 is disposed in the peripheral region 201 of the semiconductor substrate.

The memory cell array 210 may include a plurality of banks BK1~BKN (N is a natural number greater than two) which extend in a first (row) direction D1 and are arranged in a second (column) direction D2, and each of the plurality of banks BK1~BKN is divided into a plurality of bays which are arranged in the first direction D1. For example, the bank BK1 may include a plurality of bays Bay11~Bay1M (M is a natural number greater than two), the bank BK2 may include a plurality of bays Bay21~Bay2M and the bank BKN may include a plurality of bays BayN1~BayNM.

The write circuit 410 may include a plurality of write drivers 411~41N corresponding to the banks arranged in a column direction.

The control voltage generator 260 may generate a first control voltage VCTL1 and a second control voltage VCTL2 based on the reference current IREF and may provide the first control voltage VCTL1 and the second control voltage VCTL2 to a write driver corresponding to the bank and bay including the selected memory cell, of the plurality of write drivers 411~41N. The control voltage generator 260 may receive the bias voltage Vb.

Figure 11:
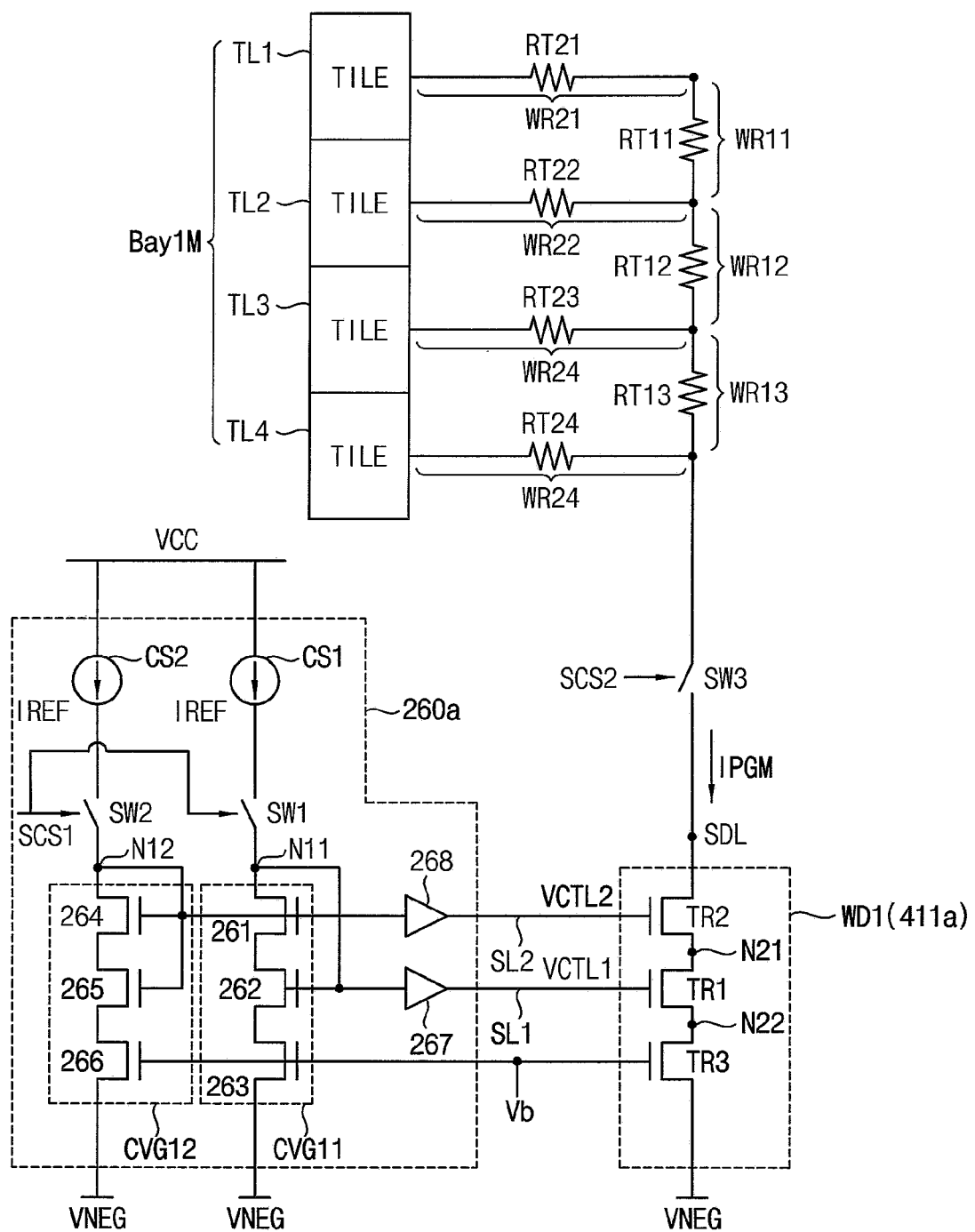
FIG. 11 illustrates a first bay, the control voltage generator and a first write driver corresponding to the first bay, in the resistive memory device of FIG. 10 according to some example embodiments.

FIG. 11 illustrates a first bay, the control voltage generator and a first write driver corresponding to the first bay, in the resistive memory device of FIG. 10 according to some example embodiments.

Referring to FIG. 11, the bay Bay1M of the bays Bay11~Bay1M included in the bank BK1 may include K (here, K is four) tiles TL1~TL4. Each of other bays Bay12~Bay1M may include K tiles.

A control voltage generator 260a may include current sources CS1 and CS2 coupled to a power supply voltage VCC, switches SW1 and SW2, a first control voltage generation circuit CVG11, a second control voltage generation circuit CVG12 and buffers 267 and 268. In example embodiments, the control voltage generator 260a may receive the reference current IREF instead of including the current sources CS1 and CS2.

The first control voltage generation circuit CVG11 may include n-channel metal-oxide semiconductor (NMOS) transistors 261, 262 and 263 connected in series between a first node N11 and a negative voltage VNEG The first node N11 is connected to the switch SW1. The NMOS transistors 261, 262 and 263 may be referred to as a first active element, a second active element and a fifth active element, respectively. The NMOS transistor 261 is connected to the first node N11, the NMOS transistor 262 is connected between the NMOS transistors 261 and 263 and the NMOS transistor 263 is connected to the negative voltage VNEG A gate of the NMOS transistor 262 is connected to the first node N11 and the first control voltage generation circuit CVG11 provides a voltage of the first node N11 based on the reference current IREF as the first control voltage VCTL1 to a write driver 411a through the buffer 267 and a signal line SL1.

The second control voltage generation circuit CVG12 may include NMOS transistors 264, 265 and 266 connected in series between a second node N12 and the negative voltage VNEG The second node N12 is connected to the switch SW2. The NMOS transistors 264, 265 and 266 may be referred to as a third active element, a fourth active element and a sixth active element, respectively. The NMOS transistor 264 is connected to the second node N12, the NMOS transistor 265 is connected between the NMOS transistors 264 and 266 and the NMOS transistor 266 is connected to the negative voltage VNEG Each gate of the NMOS transistors 264 and 265 is connected to the second node N12 and the second control voltage generation circuit CVG12 provides a voltage of the second node N12 based on the reference current IREF as the second control voltage VCTL2 to the a write driver 411a through the buffer 268 and a signal line SL2.

The switch SW1 provides the first node N11 with the reference current IREF from the current source CS1 in response to a first switching control signal SCSI and the switch SW2 provides the second node N12 with the reference current IREF from the current source CS2 in response to the first switching control signal SCSI.

The (first) write driver 411a includes a shielding transistor TR2, a bias transistor TR1 and a degeneration element TR3 connected in series between a data sensing node SDL and the negative voltage VNEG. The bias transistor TR1 is connected between nodes N21 and N22, has a gate receiving the first control voltage VCTL1 and generates a write current IPGM based on the first control voltage VCTL1. The shielding transistor TR2 is connected between the data sensing node SDL and the node N21, has a gate receiving the second control voltage VCTL2 and represents a voltage drop depending on a resistance on a path to the selected memory cell, based on the second control VCTL2. The degeneration element TR3 is connected between the bias transistor TR1 and the negative voltage VNEG.

Because the NMOS transistors 263 and 266 and the degeneration element TR3 operate in linear region in response to the bias voltage Vb and are used as a degeneration resistor for each of the NMOS transistors 262 and 265 and the bias transistor TR1 which operate as current mirrors, current changed may be minimized (reduced) through the current mirror in the first control voltage generation circuit CVG1, the second control voltage generation circuit CVG2 and the write driver 411a.

The tiles TL1, TL2, TL3 and TL4 in the bay Bay1M may be coupled to the data sensing node SDL through wires WR21~WR24, wires WR11~WR13 and a switch SW3. The switch SW3 is closed/opened in response to a second switching control signal SCS2. The wires WR21~WR24 and wires WR11~WR13 may be internal wires in the row decoder 220 connected to the bay Bay1M. The wires WR21~WR24 may be represented as resistors RT21~RT24, respectively and the wires WR11~WR13 may be represented as resistors RT11~RT13, respectively. The resistance on a path from a selected tile to the data sensing node SDL may differ based on a position of the selected tile among the tiles TL1, TL2, TL3 and TL4 in the bay Bay1M.

A voltage drop across the shielding transistor TR2 may depend on the resistance on the path from the selected tile to the data sensing node SDL. The voltage drop across the shielding transistor TR2 may be inversely proportional to the resistance on the path from the selected tile to the data sensing node SDL. If the tile TL1 is selected among the tiles TL1, TL2, TL3 and TL4 in the bay Bay1M, a total resistance on the path from the selected tile TL1 to the data sensing node SDL correspond to RT21+RT11+RT12+RT13. Therefore, the voltage drop across the shielding transistor TR2 may decrease because the resistance on the path from the selected tile TL1 to the data sensing node SDL is great. If the tile TL4 is selected among the tiles TL1, TL2, TL3 and TL4 in the bay Bay1M, a total resistance on the path from the selected tile TL4 to the data sensing node SDL correspond to RT24. Therefore, the voltage drop across the shielding transistor TR2 may increase because the resistance on the path from the selected tile TL4 to the data sensing node SDL is small. The shielding transistor TR2 adjust (attenuates) a change of drain-source voltage of the bias transistor TR1 in inverse proportion to the resistance on the path and the bias transistor TR1 may generate the write current IPGM having a regular level.

If the write driver 411a does not include the shielding transistor TR2, the bias transistor TR1 generates the write current IPGM whose level is dependent on a drain voltage of the bias transistor TR1 and the drain voltage of the bias transistor TR1 is determined based on a resistance on a path from the selected bay to the data sensing node SDL. Therefore, the write current IPGM may have distribution.

Figure 12:
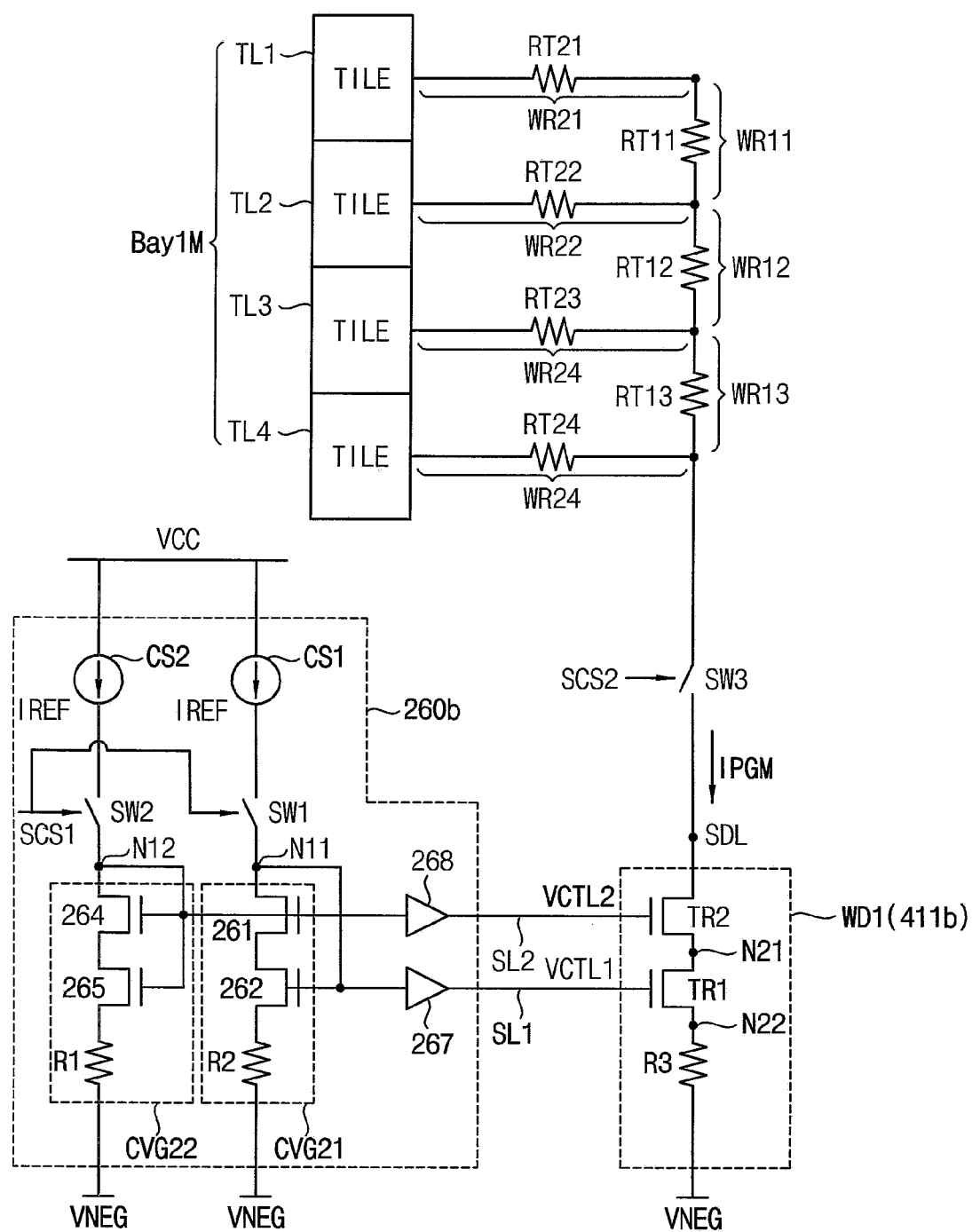
FIG. 12 illustrates a first bay, the control voltage generator and a first write driver corresponding to the first bay, in the resistive memory device of FIG. 10 according to other example embodiments.

FIG. 12 illustrates a first bay, the control voltage generator and a first write driver corresponding to the first bay, in the resistive memory device of FIG. 10 according to other example embodiments.

FIG. 12 differs from FIG. 11 in that a first control voltage generation circuit CVG21 includes a degeneration resistor R1 instead of the NMOS transistor 263, the second control voltage generation circuit CVG22 includes a degeneration resistor R2 instead of the NMOS transistor 266, a write driver 411b includes a degeneration resistor R3 instead of the degeneration element TR3 and the bias voltage Vb is not applied to a control voltage generator 260b and the write driver 411b. Therefore, detailed description on FIG. 12 will be omitted. The degeneration resistors R1, R2 and R3 may have a substantially same resistance with respect to one another.

Figure 13:
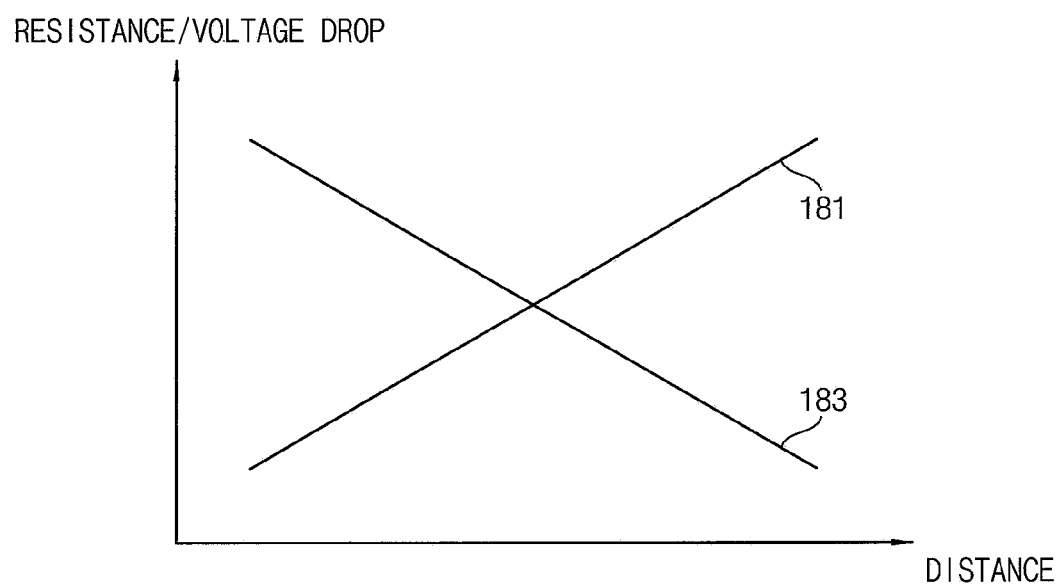
FIG. 13 is a graph showing a resistance on a path and a voltage drop across a shielding transistor according to a distance from a selected bay to a data sensing node in write drivers in FIGS. 11 and 12.

FIG. 13 is a graph showing a resistance on a path and a voltage drop across a shielding transistor according to a distance from a selected bay to a data sensing node in write drivers in FIGS. 11 and 12.

Referring to FIGS. 11 through 13, in the write driver 411a or 411b, a resistance on a path 181 is proportional to a distance from a selected bay to the data sensing node SDL. Voltage drop 183 across the shielding transistor TR2 is inversely proportional to the distance from the selected bay to the data sensing node SDL.

Figure 14:
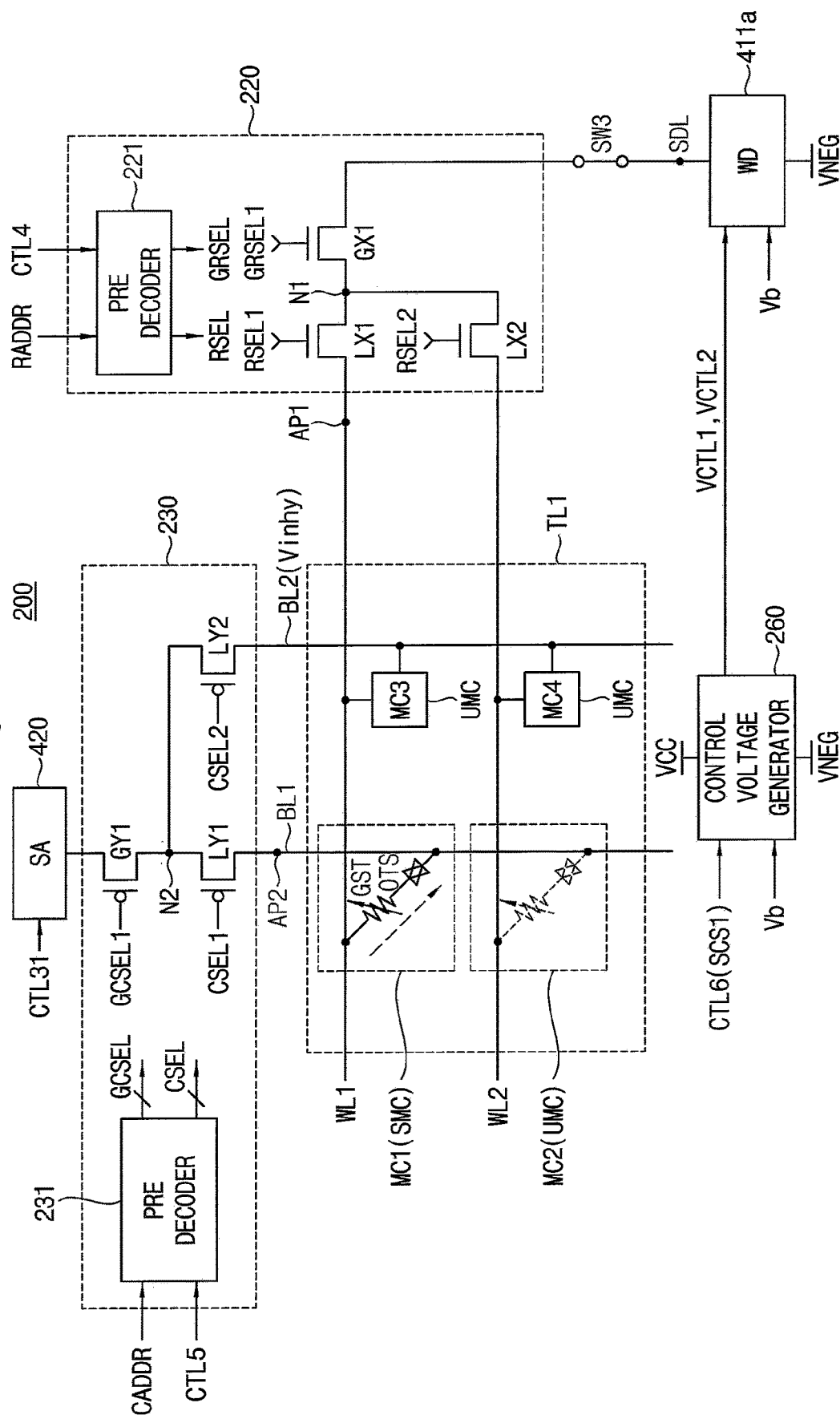
FIG. 14 illustrates a portion of the resistive memory device in FIG. 3 according to some example embodiments.

FIG. 14 illustrates a portion of the resistive memory device in FIG. 3 according to some example embodiments.

Referring to FIG. 14, the resistive memory device 200 includes the first tile TL1, the row decoder 220, the column decoder 230, the write driver 410, the control voltage generator 260 and the read circuit 420.

FIG. 14 illustrates the first tile TL1 including memory cells MC1, MC2, MC3 and MC4 connected to (e.g., coupled to and/or directly connected to) word-lines WL1 and WL2 and bit-lines BL1 and BL2. The memory cell MC1 is a selected memory cell SMC and each of the memory cells MC1, MC2, MC3 and MC4 are unselected memory cell UMCs. Each of the memory cells MC1, MC2, MC3 and MC4 includes a phase change element GST and a selection element OTS connected to, coupled to, and/or directly connected in series.

Inhibit voltage Vinhx is applied to the word-line WL2 coupled to the unselected memory cells UMCs. Inhibit voltage Vinhy is applied to the bit-line BL2 connected to, coupled to, and/or directly connected to the unselected memory cells UMCs.

The row decoder 220 may include a pre-decoder 221, row selection switches LX1 and LX2, and a global selection switch GX1. The pre-decoder 221 decodes the row address R_ADDR and the fourth control signal CTL4 to apply a row selection signals RSEL and a global selection signal GRSEL to the row selection switches LX1 and LX2 and the global row selection switch GX1, respectively. The row selection switches LX1 and LX2 are connected in parallel to the global selection switch GX1 at a node N1.

The pre-decoder 221 applies a row selection signals RSEL1 with a high level to turn-on the row selection switch LX1, and applies a row selection signals RSEL2 with a low level to turn-off the row selection switch LX2, thereby to select the word-line WL1. The pre-decoder 221 applies global selection signal GRSEL1 with a high level to connect the write driver 411a to the selected word-line WL1.

The write driver 411a may be connected between the global selection switch GX1 and the negative voltage VNEG and may receive the first control voltage VCTL1, the second control voltage VCTL2 and the bias voltage Vb.

The control voltage generator 260 may be connected between the power supply voltage VCC and the negative voltage VNEG and may provide the first control voltage VCTL1 and the second control voltage VCTL2 to the write driver 411a in response to the sixth control signal CTL6. The sixth control signal CTL6 may include the first switching control signal SCS1.

The column decoder 230 may include a pre-decoder 231, column selection switches LY1 and LY2 and a global selection switch GY1. The pre-decoder 231 decodes the column address C_ADDR and the fifth control signal CTL5 to apply a column selection signals CSEL and a global selection signal GCSEL to the column selection switches LY1 and LY2 and the global row selection switch GY1, respectively. The column selection switches LY1 and LY2 are connected/coupled in parallel to the global selection switch GY1 at a node N2.

The pre-decoder 231 applies a column selection signals CSEL1 with a high level to turn-on the column selection switch LY1, and applies a column selection signals CSEL2 with a low level to turn-off the column selection switch LY2 thereby to select the bit-line BL1 and applies global selection signal GCSEL1 with a high level to connect the read circuit 420 to the selected bit-line BL1. The read circuit 420 may receive a control signal CTL31 and the control signal CTL31 may be included in the third control signal CTL3.

The effect due to a set write current or a set write voltage, which the selected memory cell SMC experiences, may be different according to a distance to the selected memory cell SMC from at least one of a first access point AP1 or a second access point AP2. The first access point AP1 corresponds to the row selection switch LX1 to the selected the word-line WL1 connected/coupled to the selected memory cell SMC and the second access point AP2 corresponds to the column selection switch LY1 to selected the bit-line BL1 connected/coupled to the selected memory cell SMC.

Figure 15:
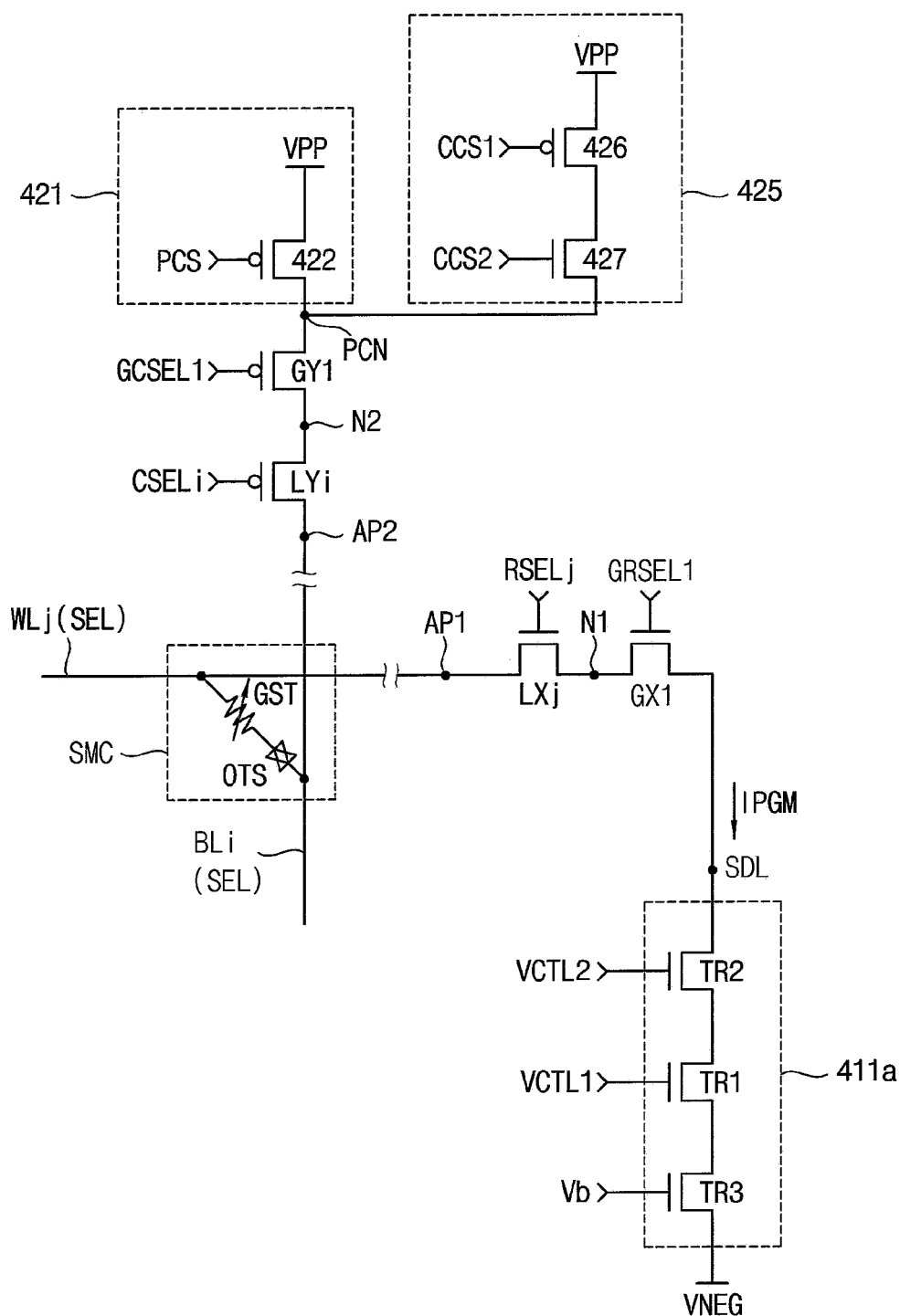
FIG. 15 illustrates the resistive memory device of FIG. 14 in detail.

FIG. 15 illustrates the resistive memory device of FIG. 14 in detail.

In FIG. 15, the read circuit 420 in FIG. 14 includes a precharge circuit 421 and a clamping circuit 425. Additionally, the write driver 411a in FIG. 12 is employed.

Referring to FIG. 15, the precharge circuit 421 includes a first p-channel metal-oxide semiconductor (PMOS) PMOS transistor 422 connected/coupled between a power supply voltage VPP and a precharge node PCN. A gate of the first PMOS transistor 422 receives a precharge control signal PCS.

The clamping circuit 425 is connected/coupled to the precharge node PCN in parallel with the precharge circuit 421 and includes a second PMOS transistor 426 and a first NMOS transistor 427.

The second PMOS transistor 426 and the first NMOS transistor 427 are connected/coupled in series between the power supply voltage VPP and the precharge node PCN. Gates of the second PMOS transistor 426 and the first NMOS transistor 427 receive clamping control signals CCS1 and CCS2, respectively.

The precharge control signal PCS and the clamping control signals CCS1 and CCS2 may be included in the control signal CTL31.

A selected word-line WLj (SEL) coupled to the selected memory cell SMC is connected/coupled to the write driver 411a through a row selection switch LXj and the global selection switch GX1 which are turned on based on a row selection signal RSELj and the global selection signal GRSEL1, respectively, and a selected bit-line BLi (SEL) connected/coupled to the selected memory cell SMC is connected/coupled to the precharge circuit 421 and the clamping circuit 425 through a column selection switch LYi and the global selection switch GY1 which are turned on based on a column selection signal CSELi and the global selection signal GCSEL1, respectively.

A current IPGM from the selected memory cell SMC flows into the data sensing node SDL coupled to the write driver 411a.

Figure 16:
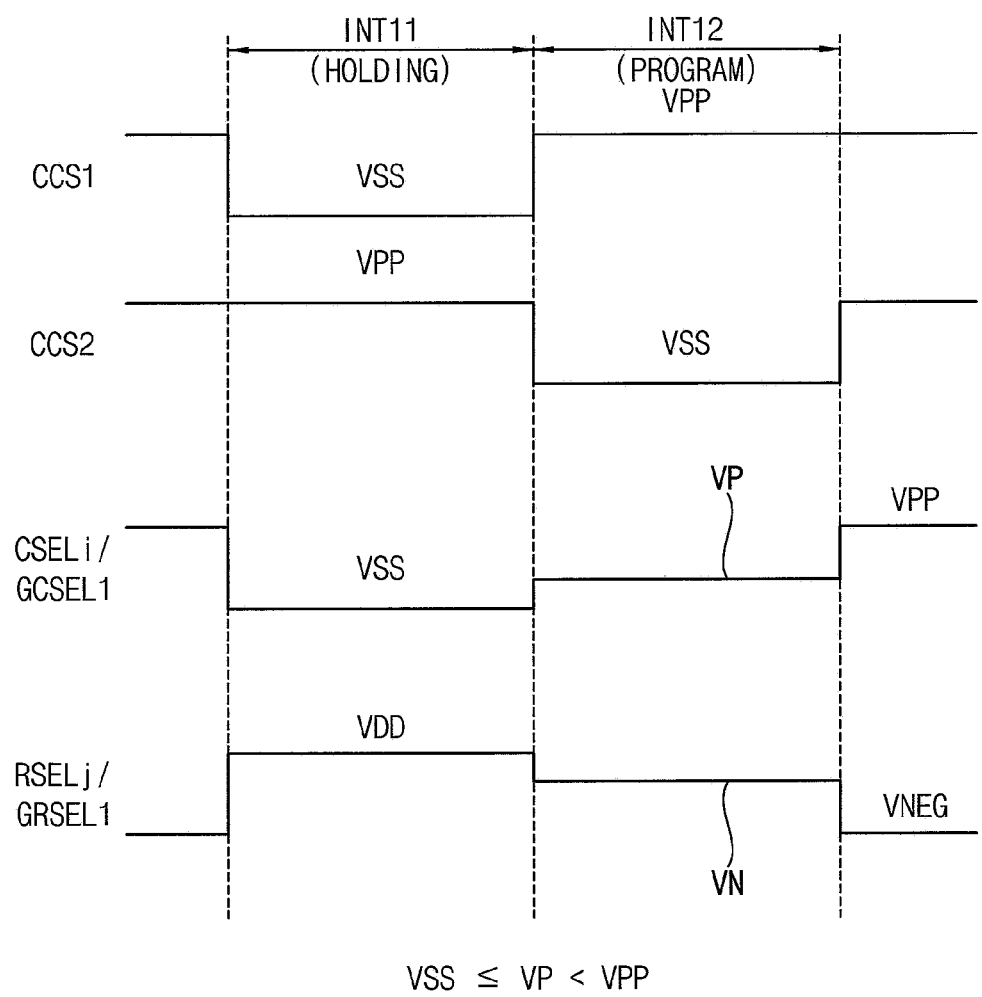
FIG. 16 illustrates levels of selection signals applied to a row selection switch and a column selection switch.

FIG. 16 illustrates levels of selection signals, e.g., of voltages, applied to the row selection switch and the column selection switch according to a distance from the access point to the selected memory cell in the resistive memory device of FIG. 15, respectively.

Referring to FIGS. 15 and 16, during a first interval INT1 corresponding a stand-by interval, the column selection signal CSELi and the global selection signal GCSEL1 with the ground voltage VSS are applied to the column selection switch LYi and the global selection switch GY1, respectively, the row selection signal RSELj and the global selection signal GRSEL1 with the power supply voltage VDD are applied to the row selection switch LXj and the global selection switch GX1, respectively, a first clamping control signal CCS1 having the ground voltage VSS is applied to the gate of the PMOS transistor 426, and a second clamping control signal CCS2 having the power supply voltage VDD is applied to the gate of the NMOS transistor 427. Therefore, a program current is not applied to the selected memory cell SMC.

During a second interval INT2 corresponding a program interval, the column selection signal CSELi and the global selection signal GCSEL1 with a level VP are applied to the column selection switch LYi and the global selection switch GY1, respectively, the row selection signal RSELj and the global selection signal GRSEL1 with a level VN are applied to the row selection switch LXj and the global selection switch GX1, respectively. In addition, the first clamping control signal CCS1 having the power supply voltage VPP is applied to the gate of the PMOS transistor 426, and the second clamping control signal CCS2 having the ground voltage VDD is applied to the gate of the NMOS transistor 427. Therefore, the program current IPGM is applied to the selected memory cell SMC.

Here, the level VP is equal to or greater than the ground voltage VSS. In addition, the level VN is greater than negative voltage VNEG and is equal to or less than the power supply voltage VDD.

When the program operation is completed, the column selection signal CSELi and the global selection signal GCSEL1 with the power supply voltage VPP are applied to the column selection switch LYi and the global selection switch GY1, respectively, the row selection signal RSELj and the global selection signal GRSEL1 with the negative voltage VNEG are applied to the row selection switch LXj and the global selection switch GX1, respectively.

Figure 17:
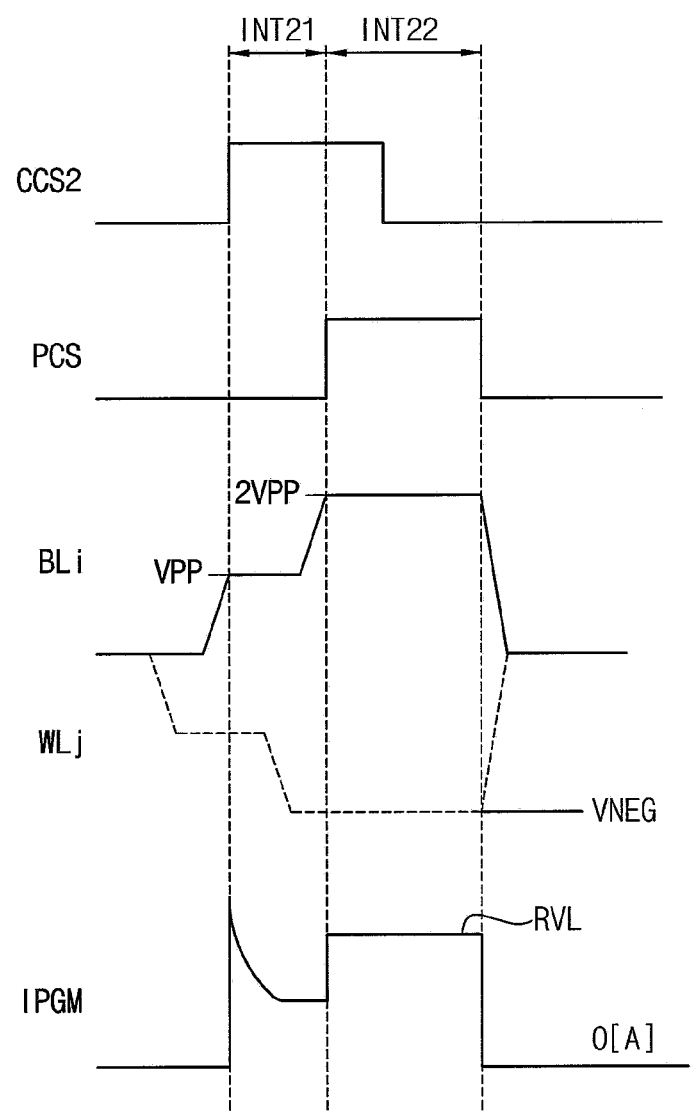
FIG. 17 illustrates levels of a selected bit-line, a selected word-line and a program current when a program operation is performed in the resistive memory device of FIG. 15.

FIG. 17 illustrates levels of a selected bit-line, a selected word-line and a program current when a program operation is performed in the resistive memory device of FIG. 15.

Referring to FIGS. 15 and 17, the control circuit 300 precharges the selected bit-line BLi with a first power supply voltage VPP during a first internal INT21 and precharges the selected bit-line BLi with a second power supply voltage 2VPP during a second internal INT22 by activating the clamping control signal CCS2 with a high level before activating the precharge control signal PCS and by partially overlapping activation intervals of the clamping control signal CCS2 and the precharge control signal PCS.

A voltage level of the selected word-line WLj is reduced to a level lower than a ground voltage and greater than the negative voltage VNEG before the first interval INT21 and is reduced to a level corresponding to the negative voltage VNEG during the second interval INT22.

The write current IPGM is zero before the first interval INT21 because a current does not flow into the selected memory cell SMC before the first interval INT21, the write current IPGM has a level greater than zero during the first interval INT21 because a current begins to flow into the selected memory cell SMC during the first interval INT21 and write current IPGM with a constant (regular) level RVL is provided to the selected memory cell SMC during the second interval INT22 because of operation of the bias transistor TR1.

Figure 18:
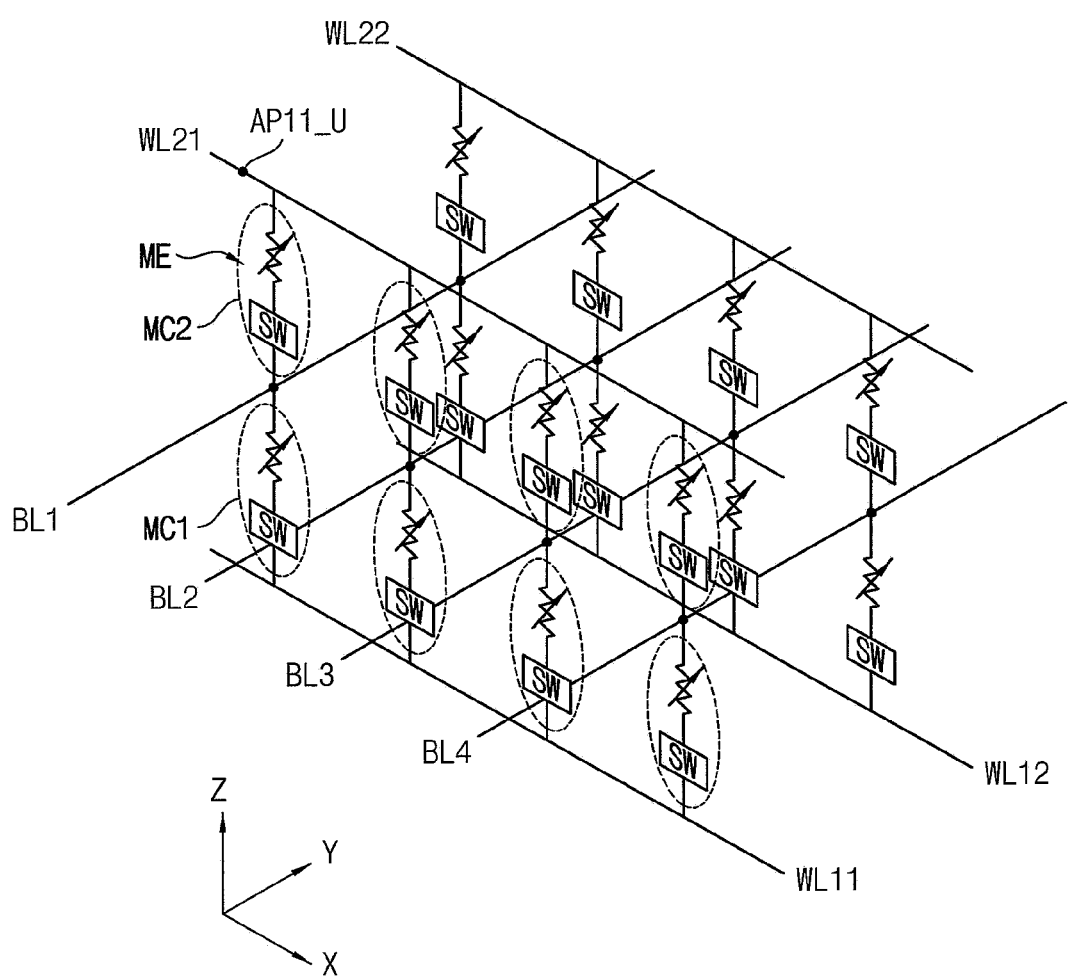
FIG. 18 is an equivalent circuit diagram illustrating a memory cell array according to some example embodiments.

FIG. 18 is an equivalent circuit diagram illustrating a memory cell array according to some example embodiments.

Referring to FIG. 18, a memory cell array 210c includes lower word-lines WL11 and WL12, which extend in a first direction X and are spaced apart from each other in a second direction Y perpendicular to the first direction X, and upper word-lines WL21 and WL22, which extend in the first direction X and are spaced apart from each other in the second direction Y. The upper word-lines WL21 and WL22 are spaced apart from the lower word-lines WL11 and WL12 in a third direction Z perpendicular to the first and second directions X and Y. In addition, the memory cell array 210c includes common bit-lines BL1, BL2, BL3, and BL4, which are spaced apart from each other in the first direction X and spaced apart from the upper word-lines WL21 and WL22 and the lower word-lines WL11 and WL12 in the third direction Z, and extend in the second direction Y.

First and second memory cells MC1 and MC2 are disposed, respectively, between the common bit-lines BL1, BL2, BL3, and BL4 and the lower word-lines WL11 and WL12, and between the common bit-lines BL1, BL2, BL3, and BL4 and the upper word-lines WL21 and WL22. For example, the first memory cells MC1 may be arranged at respective intersections of the common bit-lines BL1, BL2, BL3, and BL4 and the lower word-lines WL11 and WL12, and each of the first memory cells MC1 may include a variable resistance pattern ME for storing data and a selection device SW for selecting the variable resistance pattern ME. The second memory cells MC2 may be arranged at respective intersections of the common bit-lines BL1, BL2, BL3, and BL4 and the upper word-lines WL21 and WL22, and each of the second memory cells MC2 may also include the variable resistance pattern ME for storing data and the selection device SW for selecting the variable resistance pattern ME.

The first and second memory cells MC1 and MC2 may have substantially the same structure and may be arranged in the third direction Z. For example, in the first memory cell MC1 arranged between the lower word-line WL11 and the common bit-line BL1, the selection device SW may be electrically connected to the lower word-line WL11, the variable resistance pattern ME may be electrically connected, e.g., directly electrically connected or coupled, to the common bit-line BL1, and the variable resistance pattern ME and the selection device SW may be similarly connected in series to each other. Similarly, in the second memory cell MC2 arranged between the upper word-line WL21 and the common bit-line BL1, the variable resistance pattern ME may be electrically connected, e.g., directly electrically connected or coupled, to the upper word-line WL21, the selection device SW may be similarly electrically connected to the common bit-line BL1, and the variable resistance pattern ME and the selection device SW may be connected in series to each other.

When the memory cell array 210 includes the memory cell array 210c of FIG. 18, the write driver 411a or 411b may (automatically) compensate for resistance distribution depending on a physical position of a tile including the selected memory cell and may provide the selected memory cell with a write current with a regular level.

Figure 19:
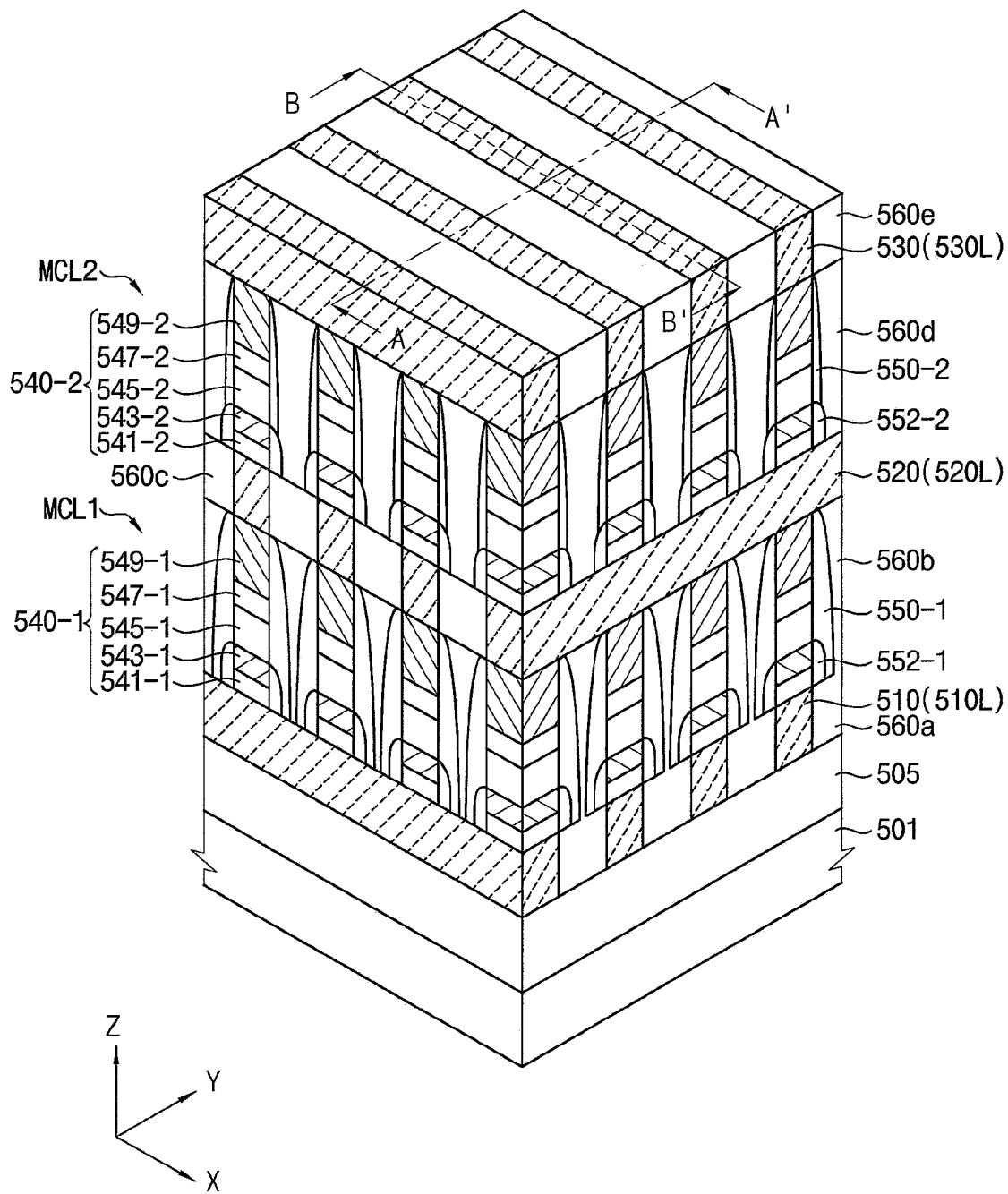
FIG. 19 is a perspective view of a memory device according to some example embodiments and FIG. 20 is a sectional view taken along lines A-A' and B-B' of FIG. 19.
Figure 20:
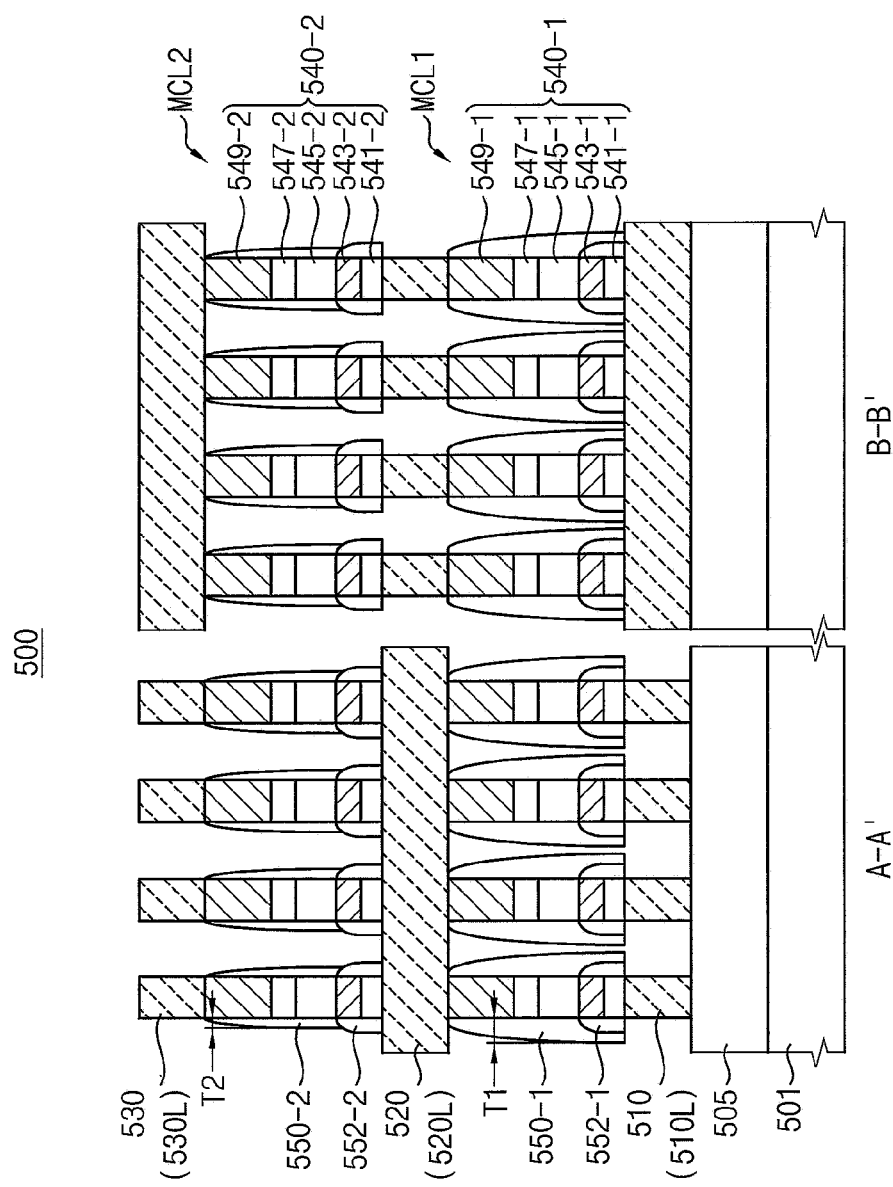

FIG. 19 is a perspective view of a memory device according to some example embodiments and FIG. 20 is a sectional view taken along lines of A-A' and B-B' FIG. 19.

To reduce complexity in the drawings and to provide a better understanding, insulating layers 560a, 560b, 560c, 560d, and 560e are omitted from FIG. 20.

Referring to FIGS. 19 and 20, a memory device 500 includes a substrate 501, a first electrode line layer 510L, a second electrode line layer 520L, a third electrode line layer 530L, a first memory cell layer MCL1, a second memory cell layer MCL2, first spacers 550-1, and second spacers 550-2.

As shown in FIGS. 19 and 20, an interlayered insulating layer 505 is arranged on the substrate 501. The interlayered insulating layer 505 may be formed of an oxide material (e.g., silicon oxide) and/or a nitride material (e.g., silicon nitride), and may be used to electrically isolate the first electrode line layer 510L from the substrate 501. Although the interlayered insulating layer 505 is illustrated as being arranged on the substrate 501, this is just an example, and example embodiments are not limited thereto. For example, in the memory device 500 according to some example embodiments, an integrated circuit layer may be arranged on the substrate 501, and memory cells may be arranged on the integrated circuit layer. The integrated circuit layer may include, for example, a peripheral circuit for operation of the memory cells and/or a core circuit for calculations. Here, the structure, in which an integrated circuit layer including a peripheral circuit and/or a core circuit is arranged on a substrate and memory cells are arranged on the integrated circuit layer, may be referred to as a cell-on-peripheral (COP) structure.

The first electrode line layer 510L may include a plurality of first electrode lines 510, which extend in the first direction X and are arranged in parallel to each other and spaced apart from each other in the second direction Y. The second electrode line layer 520L may include a plurality of second electrode lines 520, which extend in the second direction Y and are arranged in parallel to each other and spaced apart from each other in the first direction X. In addition, the third electrode line layer 530L may include a plurality of third electrode lines 530, which extend in the first direction X and are arranged in parallel to each other and spaced apart from each other in the second direction Y.

In operational aspects of a memory device, the first and third electrode lines 510 and 530 may serve as word-lines, and the second electrode lines 520 may serve as bit-lines. When the first and third electrode lines 510 and 530 serve as the word-lines, the first electrode lines 510 may serve as lower word-lines and the third electrode lines 530 may serve as upper word-lines. In addition, the second electrode lines 520 may be shared by the lower word-lines and the upper word-lines. For example, the second electrode lines 520 may serve as common bit-lines. Each of the first electrode lines 510, the second electrode lines 520, and the third electrode lines 530 may include, for example, metals, conductive metal nitrides, conductive metal oxides, or combinations thereof The first electrode lines 510, the second electrode lines 520, and the third electrode lines 530 may be formed of the same, or alternatively of different, metals. A thickness of the first electrode lines 510, a thickness of the second electrode lines 520, and a thickness of the third electrode lines may be the same, or may be different, from one another. A sheet resistance and/or a resistivity of each of the first electrode lines 510, the second electrode lines 520, and the third electrode lines 530 may be the same as, or alternatively may be different from, one another.

The first memory cell layer MCL1 includes a plurality of first memory cells 540-1, which are spaced apart from each other in the first and second directions X and Y and serve as the first memory cells MC1 of FIG. 18. The second memory cell layer MCL2 includes a plurality of second memory cells 540-2, which are spaced apart from each other in the first and second directions X and Y and serve as the second memory cells MC2 of FIG. 18. As shown in FIG. 19, the first electrode lines 510 and the second electrode lines 520 intersect each other, and the second electrode lines 520 and the third electrode lines 530 intersect each other. The first memory cells 540-1 are disposed between the first electrode line layer 510L and the second electrode line layer 520L and at respective intersections of the first electrode lines 510 and the second electrode lines 520, and are connected to the first electrode lines 510 and the second electrode lines 520. The second memory cells 540-2 are disposed between the second and third electrode line layers 520L and 530L and at respective intersections of the second and third electrode lines 520 and 530, and are connected to the second and third electrode lines 520 and 530.

In some example embodiments, each of the first and second memory cells 540-1 and 540-2 has a pillar-shaped structure with a rectangular section. Each of the first memory cells 540-1 and each of the second memory cells 540-2 include, respectively, a lower electrode 541-1 and a lower electrode 541-2, a selection device 543-1 and a selection device 543-2, an intermediate electrode 545-1 and an intermediate electrode 545-2, a heating electrode 547-1 and a heating electrode 547-2, and a variable resistance pattern 549-1 and a variable resistance pattern 549-2. Because the first and second memory cells 540-1 and 540-2 have substantially the same structure, the following description will be given with reference to the first memory cells 540-1, for convenience of discussion.

The first spacers 550-1 are provided to enclose side surfaces of the first memory cells 540-1. The second spacers 550-2 are provided to enclose side surfaces of the second memory cells 540-2. Because the first and second spacers 550-1 and 550-2 are provided to enclose the side surfaces of the first and second memory cells 540-1 and 540-2, the first and second spacers 550-1 and 550-2 may be used to protect the first and second memory cells 540-1 and 540-2 (in particular, the variable resistance patterns 549-1 and 549-2 and/or the selection devices 543-1 and 543-2).

In the memory device 500, the first spacer 550-1 has a first thickness T1, and the second spacer 550-2 has a second thickness T2. In some example embodiments, the first thickness T1 and greater than the second thickness T2. In the memory device 500, by forming thick first spacers 550-1 of the first memory cells 540-1 and forming thinner second spacers 550-2 of the second memory cells 540-2, resistance characteristics of the first and second memory cells 540-1 and 540-2 may be modified, e.g., may be enhanced.

The memory device 500 further includes a first inner spacer 552-1 and a second inner spacer 552-2. The first inner spacer 552-1 is provided to cover the lower electrode 541-1 and the selection device 543-1 of the first memory cell 540-1, and the second inner spacer 552-2 is provided to cover the lower electrode 541-2 and the selection device 543-2 of the second memory cell 540-2. The first and second inner spacers 552-1 and 552-2 may be formed, using a process separate from that used to form the first and second spacers 550-1 and 550-2, for more effective protection of the selection devices 543-1 and 543-2. However, in some example embodiments, the first and second inner spacers 552-1 and 552-2 are omitted.

As shown in FIG. 19, a first insulating layer 560a is arranged between the first electrode lines 510, and a second insulating layer 560b is arranged between the first memory cells 540-1 of the first memory cell layer MCL1. In addition, a third insulating layer 560c is arranged between the second electrode lines 520, a fourth insulating layer 560d is arranged between the second memory cells 540-2 of the second memory cell layer MCL2, and a fifth insulating layer 560e is arranged between the third electrode lines 530.

Figure 21:
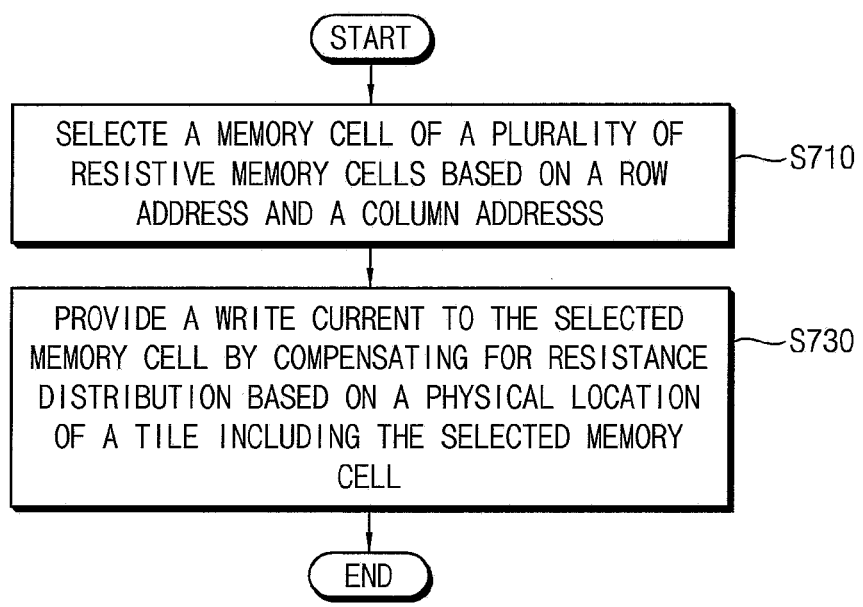
FIG. 21 is a flow chart illustrating a method of operating a resistive memory device according to some example embodiments.

FIG. 21 is a flow chart illustrating a method of operating a resistive memory device according to some example embodiments.

Referring to FIGS. 3 through 21, in a method of operating a resistive memory device 200 including a memory cell array 210 that includes a plurality of resistive memory cells connected/coupled to a plurality of word-lines and a plurality of bit-lines and includes a plurality of bays, each including K tiles and a plurality of write drivers corresponding to the plurality of bays, the row decoder 220 and the column decoder 230 determines one of the resistive memory cells as a selected memory cell based on the address ADDR including the row address and the column address (S710).

A first write driver of the plurality of write drivers, corresponding to a first bay including the selected memory cell, (automatically) compensates for resistance distribution depending on a physical position of the first bay including the selected memory cell and provides the selected memory cell with a write current with a regular level (S730).

Figure 22:
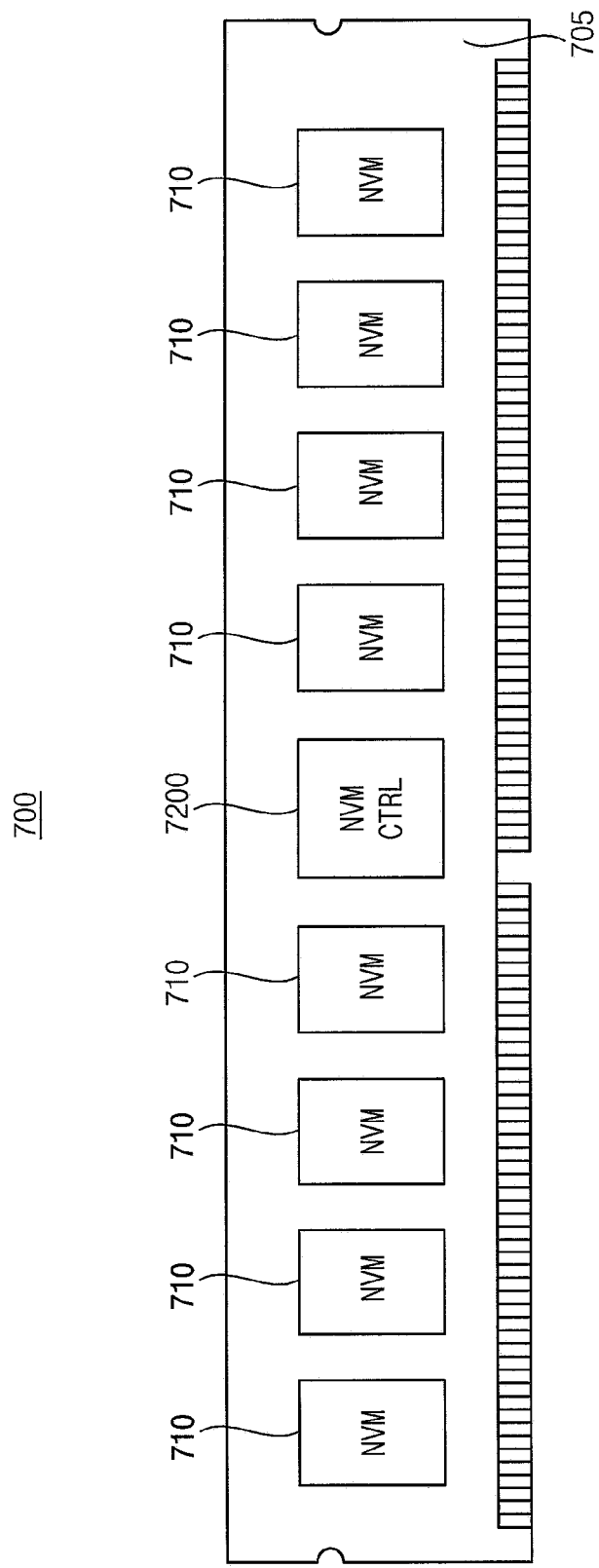
FIG. 22 is a diagram illustrating a nonvolatile memory module according to some example embodiments.

FIG. 22 is a diagram illustrating a nonvolatile memory module according to some example embodiments.

Referring to FIG. 22, a nonvolatile memory module 700 may include a plurality of nonvolatile memory chips (NVM) 710, and a module controller (NVM CTRL) 720.

As illustrated in FIG. 22, the plurality of nonvolatile memory chips 710 may be disposed on a printed circuit board (PCB) 705, and the module controller 720 may be disposed in the middle of the plurality of nonvolatile memory chips 710 on the PCB 705. In some example embodiments, the plurality of nonvolatile memory chips 710 and the module controller 720 may be disposed on the PCB 705 according to a nonvolatile dual in-line memory module (NVDIMM) standard.

In some example embodiments, each of the plurality of nonvolatile memory chips 710 may employ the resistive memory device 200 of FIG. 3. Each of the nonvolatile memory chips 710 may include phase change memory cells. In some example embodiments, at least one of the plurality of nonvolatile memory chips 710 may include NAND flash memory device and the rest of the plurality of nonvolatile memory chips 710 may employ the resistive memory device 200 of FIG. 3.

The module controller 720 may receive a command signal, an address signal, and data from the memory controller 100, and may control operations of the plurality of nonvolatile memory chips 710 by providing the command signal, the address signal, and/or the data to at least one of the plurality of nonvolatile memory chips 710.

Figure 23:
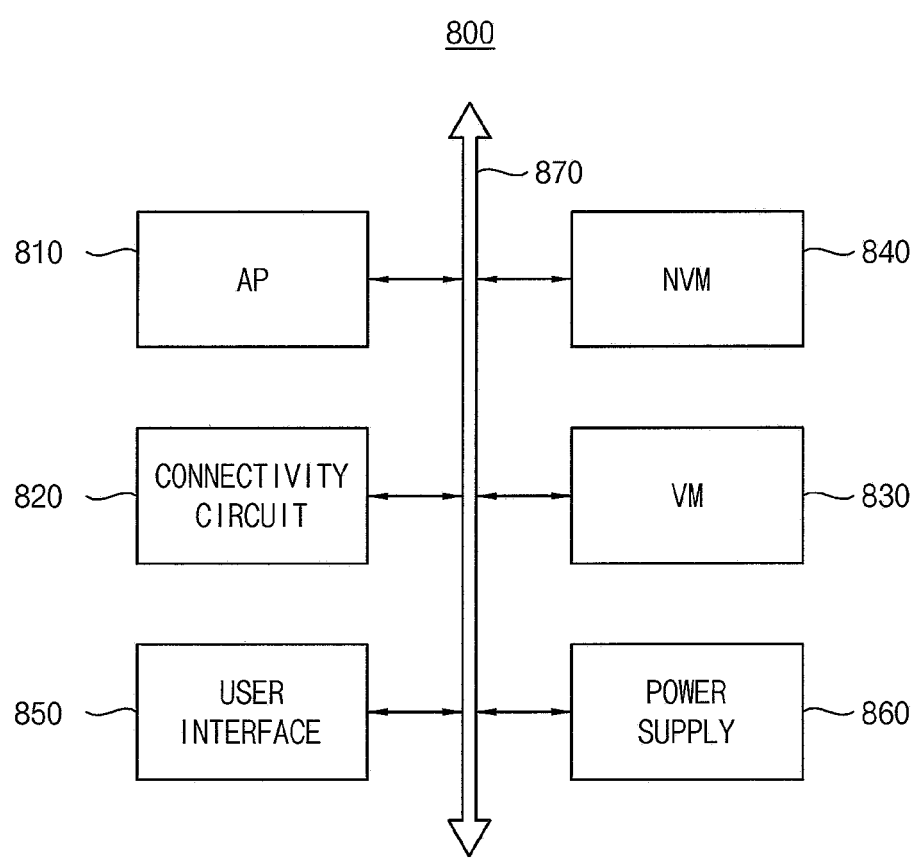
FIG. 23 is a block diagram illustrating a mobile system according to some example embodiments.

FIG. 23 is a block diagram illustrating a mobile system according to some example embodiments.

Referring to FIG. 23, a mobile system 800 includes an application processor (AP) 810, a connectivity circuit 820 a volatile memory device (VM) 830, a nonvolatile memory device (NVM) 840, a user interface 850, and a power supply 860 connected through a system bus 870. Any or all of the components of the mobile system 800, such as the AP 810, the connectivity circuit 820, the VM 830, the NVM 840, the user interface 850, or the power supply 860 may include processing circuitry such as hardware including logic circuits; a hardware/software combination such as a processor executing software; or a combination thereof.

The application processor 810 may execute applications such as at least one of a web browser, a game application, a video player, etc. The connectivity circuit 820 may perform wired and/or wireless communication with an external device.

The volatile memory device 830 may store data processed by the application processor 3100, or may operate as a working memory. For example, the volatile memory device 830 may be or include a DRAM, such as at least one of a double data rate synchronous dynamic random access memory (DDR SDRAM), low power DDR (LPDDR) SDRAM, graphics DDR (GDDR) SDRAM, Rambus DRAM (RDRAM), etc.

The nonvolatile memory device 840 may store a boot image for booting the mobile system 800 and other data. The nonvolatile memory device 840 may be or include a phase change random access memory (PRAM) using a phase change materials, a resistance random access memory (RRAM) using a variable resistance material such as complex metal oxide, and/or a magneto-resistive random access memory (MRAM) using a magnetic material.

The user interface 850 may include at least one input device, such as a keypad, a touch screen, etc., and at least one output device, such as a speaker, a display device, etc. The power supply 860 may supply a power supply voltage to the mobile system 800.

The nonvolatile memory device 840 may (automatically) compensate for resistance distribution depending on a physical position of the first bay including the selected memory cell and provide the selected memory cell with a write current with a regular level as described with reference to FIGS. 1 through 21.

The example embodiments may be applied to resistive memory devices and systems including the resistive memory devices.

While example embodiments have been shown and described above, it will be apparent to those skilled in the art that many variations and modifications can be made to the described example embodiments without substantially departing from the principles of the present disclosure as defined by the appended claims.

What is claimed is:

1. A resistive memory device comprising:
   a memory cell array comprising a plurality of resistive memory cells connected to a plurality of word-lines and to a plurality of bit-lines, the memory cell array being divided into a plurality of bays each of which comprises K tiles, K being a natural number greater than one;
   a write/read circuit connected to the memory cell array through a row decoder and through a column decoder, the write/read circuit being configured to perform a write operation in a target tile of the memory cell array, the write/read circuit comprising a plurality of write drivers corresponding to the plurality of bays;
   a control voltage generator configured to generate a first control voltage and a second control voltage based on a reference current, and provide the first control voltage and the second control voltage to the write/read circuit; and
   a control circuit configured to control the write/read circuit and the control voltage generator,
   wherein a first write driver of the plurality of write drivers that corresponds to a first bay of the plurality of bays is configured to provide the target tile with a write current corresponding to a physical position of a selected memory cell of the target tile in the memory cell array.

2. The resistive memory device of claim 1, wherein the control voltage generator is provided in a peripheral region of a semiconductor substrate in which the resistive memory device is provided, and
   wherein the plurality of write drivers are provided in a core region of the semiconductor substrate which is separate from the peripheral region.

3. The resistive memory device of claim 1, wherein the control voltage generator comprises:
   a first control voltage generation circuit configured to generate the first control voltage based on the reference current, the first control voltage generation circuit comprising a first active element and a second active element; and
   a second control voltage generation circuit configured to generate the second control voltage based on the reference current, the second control voltage generation circuit comprising a third active element and a fourth active element.

4. The resistive memory device of claim 3, wherein the first control voltage generation circuit comprises the first active element, the second active element and a fifth active element which are connected in series between a first node receiving the reference current and a negative voltage,
   wherein the second control voltage generation circuit comprises the third active element, the fourth active element and a sixth active element which are connected in series between a second node receiving the reference current and the negative voltage, and
   wherein each of the first active element, the second active element, the third active element, the fourth active element, the fifth active element and the sixth active element comprises an n-channel metal-oxide semiconductor (NMOS) transistor.

5. The resistive memory device of claim 4, wherein a gate of the second active element is connected to the first node,
   wherein the first control voltage generation circuit is configured to provide the first control voltage to the first node,
   wherein a gate of the third active element and a gate of the fourth active element are connected to the second node, and
   wherein the second control voltage generation circuit is configured to provide the second control voltage to the second node.

6. The resistive memory device of claim 3, wherein the first control voltage generation circuit comprises the first active element, the second active element and a first resistor which are connected in series between a first node receiving the reference current and a negative voltage,
   wherein the second control voltage generation circuit comprises the third active element, the fourth active element and a second resistor which are connected in series between a second node receiving the reference current and the negative voltage, and wherein each of the first active element, the second active element the third active element and the fourth active element comprises an n-channel metal-oxide semiconductor (NMOS) transistor.

7. The resistive memory device of claim 3, wherein the control voltage generator further comprises:
a first buffer configured to buffer the first control voltage; and
a second buffer configured to buffer the second control voltage.

8. The resistive memory device of claim 1, wherein the first write driver comprises:
a bias transistor configured to generate the write current based on the first control voltage;
a shielding transistor connected between the bias transistor and a data sensing node, the shielding transistor configured to provide a voltage drop corresponding to a resistance between the data sensing node and the selected memory cell, based on the second control voltage; and
a degeneration element connected between the bias transistor and a negative voltage.

9. The resistive memory device of claim 8, wherein the voltage drop is proportional to the resistance between the data sensing node and the selected memory cell.

10. The resistive memory device of claim 8, wherein the bias transistor comprises a first n-channel metal-oxide semiconductor (NMOS) transistor which has a gate configured to receive the first control voltage,
wherein the shielding transistor comprises a second NMOS transistor which has a gate configured to receive the second control voltage, and
wherein the degeneration element comprises a third NMOS transistor which has a gate configured to receive a bias voltage, and the third NMOS transistor is connected between the first NMOS transistor and the negative voltage.

11. The resistive memory device of claim 8, wherein the bias transistor comprises a first n-channel metal-oxide semiconductor (NMOS) transistor which has a gate receiving the first control voltage,
wherein the shielding transistor comprises a second NMOS transistor which has a gate receiving the second control voltage, and
wherein the degeneration element comprises a degeneration resistor connected between the first NMOS transistor and the negative voltage.

12. The resistive memory device of claim 8, wherein the shielding transistor is configured to adjust a change of drain-source voltage of the bias transistor in inverse proportion to the resistance between the data sensing node and the selected memory cell.

13. The resistive memory device of claim 8, wherein the bias transistor is configured to generate the write current without regard to a physical position of the target tile.

14. The resistive memory device of claim 1, wherein the write/read circuit comprises:
a read circuit connected, through a column selection switch, to a selected bit-line that is connected to the selected memory cell, the selected bit-line being one of the plurality of bit-lines; and
a write circuit comprising the first write driver connected, through a row selection switch, to a selected word-line that is connected to the selected memory cell, the selected word-line being one of the plurality of word-lines.

15. The resistive memory device of claim 1, wherein each of the plurality of resistive memory cells comprises a variable resistance element and a selection element connected in series between a corresponding word-line of the plurality of word-lines and a corresponding bit-line of the plurality of bit-lines,
wherein the variable resistance element comprises a phase change material whose resistance varies according to a temperature, and
wherein the resistive memory device comprises a phase change random access memory (PRAM) device.

16. The resistive memory device of claim 1, wherein the control circuit comprises:
a command decoder configured to decode a command from an external memory controller, and output a decoded command;
an address buffer configured to receive an access address from the external memory controller, and output a row address and a column address based on the access address;
a position information generator configured to generate position information indicating a position of the selected memory cell based on the row address and the column address; and
a control signal generator configured to generate control signals to control the row decoder, the column decoder, the control voltage generator and the write/read circuit based on the decoded command and the position information.

17. The resistive memory device of claim 1, wherein the control circuit and the write/read circuit are arranged on an integrated circuit layer arranged on a substrate, and the memory cell array is arranged on the integrated circuit layer,
wherein the memory cell array comprises a first memory cell layer comprising first memory cells and a second memory cell layer comprising second memory cells, the first memory cells and the second memory cells sharing the plurality of bit-lines, and
wherein the plurality of word-lines comprise lower word-lines connected to the first memory cells and upper word-lines connected to the second memory cells.

18. A resistive memory device comprising:
a memory cell array comprising a plurality of resistive memory cells connected to a plurality of word-lines and to a plurality of bit-lines, the memory cell array being divided into a plurality of bays each of which comprises K tiles, K being a natural number greater than one;
a row decoder connected to the memory cell array through the plurality of word-lines, the row decoder comprising a plurality of row selection switches;
a column decoder connected to the memory cell array through the plurality of bit-lines, the column decoder comprising a plurality of column selection switches;
a write/read circuit connected to the memory cell array through the row decoder and the column decoder, the write/read circuit being configured to perform a write operation in a target tile of the memory cell array, the write/read circuit comprising a plurality of write drivers corresponding to the plurality of bays;
a control voltage generator configured to generate a first control voltage and a second control voltage based on a reference current, and provide the first control voltage and the second control voltage to the write/read circuit; and a control circuit configured to control the write/read circuit and the control voltage generator based on a command and an address, wherein a first write driver of the plurality of write drivers that corresponds to a first bay of the plurality of bays is configured to provide the target tile with a write current corresponding to a physical position of a selected memory cell of the target tile in the memory cell array.

19. The resistive memory device of claim 18, wherein the control voltage generator is provided in a peripheral region of a semiconductor substrate in which the resistive memory device is provided, and wherein the first write driver comprises:
  a bias transistor configured to generate the write current based on the first control voltage;
  a shielding transistor connected between the bias transistor and a data sensing node, the shielding transistor configured to provide a voltage drop corresponding to a resistance between the data sensing node and the selected memory cell, based on the second control voltage; and
  a degeneration element connected between the bias transistor and a negative voltage.

20. A method of operating a resistive memory device including a memory cell array that includes a plurality of resistive memory cells connected to a plurality of word-lines and to a plurality of bit-lines, wherein the memory cell array is divided into a plurality of bays, each of the plurality of bays includes K tiles, and K is a natural number greater than one, the method comprising:

identifying a selected memory cell from among the plurality of resistive memory cells that is provided in a target tile based on a row address and a column address indicated in a write command; and providing, by a first write driver of the write drivers, a write current corresponding to a physical position of the selected memory cell of the target tile in the memory cell array based on the write command.

* * * * *